United States Patent
Shin et al.

(10) Patent No.: US 11,410,731 B2
(45) Date of Patent: Aug. 9, 2022

(54) SEMICONDUCTOR MEMORY DEVICE AND METHOD OF OPERATING THE SAME

(71) Applicant: SK hynix Inc., Icheon-si (KR)

(72) Inventors: Jae Hyeon Shin, Icheon-si (KR); Tae Ho Kim, Icheon-si (KR); In Gon Yang, Icheon-si (KR); Sungmook Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/176,645

(22) Filed: Feb. 16, 2021

(65) Prior Publication Data
US 2022/0051723 A1    Feb. 17, 2022

(30) Foreign Application Priority Data

Aug. 12, 2020   (KR) .......................... 10-2020-0101439

(51) Int. Cl.
| *G11C 16/32* | (2006.01) |
| *G11C 16/10* | (2006.01) |
| *G11C 16/34* | (2006.01) |
| *G11C 16/24* | (2006.01) |
| *G11C 16/04* | (2006.01) |

(52) U.S. Cl.
CPC .............. *G11C 16/10* (2013.01); *G11C 16/24* (2013.01); *G11C 16/3459* (2013.01); *G11C 16/0483* (2013.01)

(58) Field of Classification Search
CPC ..... G11C 16/10; G11C 16/0483; G11C 16/08; G11C 16/24; G11C 16/26; G11C 16/32; G11C 16/3459
See application file for complete search history.

(56) References Cited

U.S. PATENT DOCUMENTS

| 2015/0325306 A1* | 11/2015 | Lee ..................... G11C 16/28 |
| | | 365/185.12 |
| 2015/0348638 A1* | 12/2015 | Kim ..................... G11C 16/32 |
| | | 365/185.12 |
| 2020/0098439 A1* | 3/2020 | Park ................... G11C 11/5635 |
| 2021/0027848 A1* | 1/2021 | Seo ..................... G11C 16/32 |
| 2021/0272626 A1* | 9/2021 | Kim ................... G11C 11/5628 |

FOREIGN PATENT DOCUMENTS

| KR | 101929614 B1 | 12/2018 |
| KR | 1020190123981 A | 11/2019 |

\* cited by examiner

*Primary Examiner* — Hien N Nguyen
(74) *Attorney, Agent, or Firm* — William Park & Associates Ltd.

(57) ABSTRACT

Provided herein is a semiconductor memory device and a method of operating the same. The semiconductor memory device includes a memory block, a peripheral circuit, and a control logic. The memory block includes a plurality of sub-blocks coupled to a plurality of source select lines, respectively. The peripheral circuit performs a program operation on the memory block. The control logic is configured to control the peripheral circuit to increase a voltage of a common source line that is coupled to the memory block, increase a voltage of at least one source select line, among the plurality of source select lines, to a first voltage level, and set a voltage of a bit line that is coupled to the memory block and increase the voltage of at least one source select line from the first voltage level to a second voltage level.

19 Claims, 24 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2020-0101439 filed on Aug. 12, 2020, in the Korean Intellectual Property Office, the entire disclosure of which is incorporated by reference herein.

BACKGROUND

1. Technical Field

Various embodiments of the present disclosure generally relate to an electronic device, and more particularly to a semiconductor memory device and a method of operating the semiconductor memory device.

2. Related Art

A semiconductor memory device may have a two-dimensional (2D) structure in which strings are horizontally arranged on a semiconductor substrate. Alternatively, the memory device may have a three-dimensional (3D) structure in which strings are vertically stacked on a semiconductor substrate. As memory devices with a 2D structure reaches its physical scaling limitations (i.e., limit in the degree of integration), semiconductor manufacturers are producing 3D memory devices that include a plurality of memory cells that are vertically stacked on a semiconductor substrate.

SUMMARY

An embodiment of the present disclosure may provide for a semiconductor memory device. The semiconductor memory device may include a memory block, a peripheral circuit, and a control logic. The memory block may include a plurality of sub-blocks that are coupled to a plurality of source select lines, respectively. The peripheral circuit may be configured to perform a data program operation on the memory block. The control logic may be configured to control the peripheral circuit to increase a voltage of a common source line that is coupled to the memory block, increase a voltage of at least one source select line, among the plurality of source select lines, to a first voltage level, and set a voltage of a bit line that is coupled to the memory block and increase the voltage of the at least one source select line from the first voltage level to a second voltage level.

An embodiment of the present disclosure may provide for a method of operating a semiconductor memory device. Based on the method of operating the semiconductor memory device, a memory block with a plurality of sub-blocks may be programmed. The plurality of sub-blocks may be coupled to a plurality of source select lines, respectively. A voltage of a common source line that is coupled to the memory block may increase, a voltage of at least one source select line, among the plurality of source select lines, may increase to a first voltage level, and a voltage of a bit line that is coupled to the memory block may be set while the voltage of the at least one source select line may increase from the first voltage level to a second voltage level.

An embodiment of the present disclosure may provide for a method of operating a semiconductor memory device. Based on the method of operating the semiconductor memory device, a memory block with a plurality of sub-blocks may be programmed. The plurality of sub-blocks may be coupled to a plurality of source select lines, respectively. A voltage of a common source line that is coupled to the memory block may increase, a voltage of at least one source select line, among the plurality of source select lines, may increase to a first voltage level, and a voltage of a bit line that is coupled to the memory block may be set and a voltage of the at least one source select line may increase from the first voltage level to a second voltage level.

DETAILED DESCRIPTION

Specific structural or functional descriptions in the embodiments of the present disclosure introduced in this specification or application are exemplified to describe embodiments according to the concept of the present disclosure. The embodiments according to the concept of the present disclosure may be practiced in various forms, and should not be construed as being limited to the embodiments described in the specification or application.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element, Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments of the present disclosure are directed to a semiconductor memory device that is capable of reducing a peak current and a method of operating the semiconductor memory device.

Figure 1:
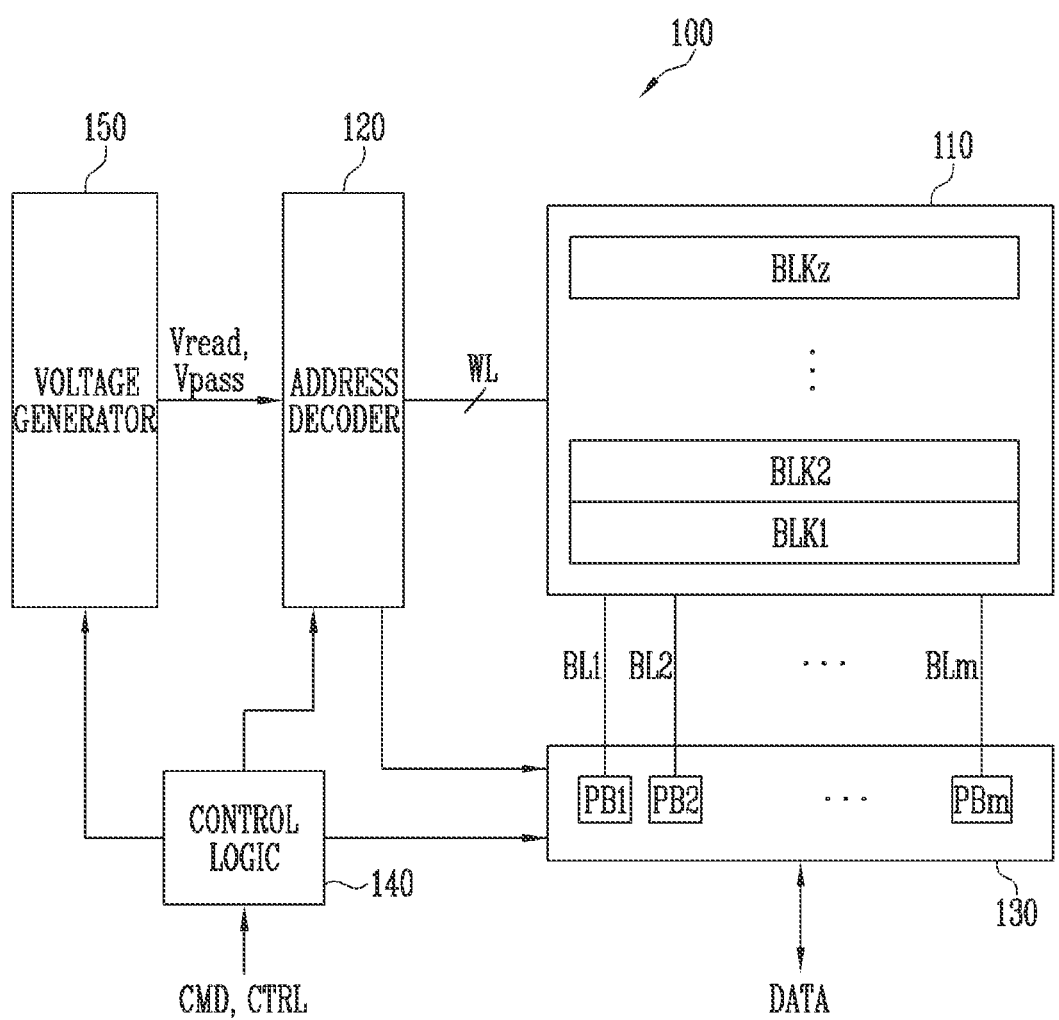
FIG. 1 is a block diagram, illustrating a semiconductor memory device, according to an embodiment of the present disclosure.

FIG. 1 is a block diagram, illustrating a semiconductor memory device, according to an embodiment of the present disclosure.

Referring to FIG. 1, the semiconductor memory device 100 may include a memory cell array 110, an address decoder 120, a read and write circuit 130, a control logic 140, and a voltage generator 150.

The memory cell array 110 may include a plurality of memory blocks BLK1 to BLKz. The memory blocks BLK1 to BLKz may be coupled to the address decoder 120 through word lines WL. The memory blocks BLK1 to BLKz may be coupled to the read and write circuit 130 through bit lines BL1 to BLm. Each of the memory blocks BLK1 to BLKz may include a plurality of memory cells. In an embodiment, the plurality of memory cells may be nonvolatile memory cells and may be implemented as nonvolatile memory cells with a vertical channel structure. The memory cell array 110 may be implemented as a memory cell array with a two-dimensional (2D) structure. In an embodiment, the memory cell array 110 may be implemented as a memory cell array with a three-dimensional (3D) structure, Each of the memory cells that are included in the memory cell array may store at least one bit of data. In an embodiment, each of the memory cells included in the memory cell array 110 may be a single-level cell (SLC), which stores 1-bit data. In an embodiment, each of the memory cells included in the memory cell array 110 may be a multi-level cell (MLC), which stores 2-bit data. In an embodiment, each of the memory cells included in the memory cell array 110 may be a triple-level cell (TLC), which stores 3-bit data. In an embodiment, each of the memory cells included in the memory cell array 110 may be a quad-level cell (QLC), which stores 4-bit data. In various embodiments, the memory cell array 110 may include a plurality of memory cells, each of which stores 5 or more bits of data.

The address decoder 120, the read and write circuit 130, the control logic 140, and the voltage generator 150 may be operated as a peripheral circuit to drive the memory cell array 110. The address decoder 120 may be coupled to the memory cell array 110 through the word lines WL. The address decoder 120 may be operated based on the control logic 140. The address decoder 120 may receive addresses through an input/output buffer (not illustrated) that is provided in the semiconductor memory device 100.

The address decoder 120 may decode a block address, among the received addresses. The address decoder 120 may select at least one memory block based on the decoded block address. When a read voltage application operation is performed during a read operation, the address decoder 120 may apply a read voltage Vread that is generated by the voltage generator 150 to a selected word line of a selected memory block and may apply a pass voltage Vpass to the remaining unselected word lines. During a program verify operation, the address decoder 120 may apply a verify voltage that is generated by the voltage generator 150 to a selected word line of a selected memory block and may apply the pass voltage Vpass to the remaining unselected word lines.

The address decoder 120 may decode a column address, among the received addresses. The address decoder 120 may transmit the decoded column address to the read and write circuit 130.

The read and program operations of the semiconductor memory device 100 may each be performed on a page by page basis. Addresses that are received at the request of read and program operations may include a block address, a row address, and a column address. The address decoder 120 may select one memory block and one word line based on the block address and the row address. The column address may be decoded by the address decoder 120 and may then be provided to the read and write circuit 130.

The address decoder 120 may include a block decoder, a row decoder, a column decoder, an address buffer, etc.

The read and write circuit 130 may include a plurality of page buffers PB1 to PBm. The read and write circuit 130 may be operated as a "read circuit" during a read operation of the memory cell array 110 and as a "write circuit" during a write operation. The plurality of page buffers PB1 to PBm may be coupled to the memory cell array 110 through the bit lines BL1 to BLm. During a read or program verify operation, in order to sense threshold voltages of the memory cells, the page buffers PB1 to PBm may continuously supply a sensing current to the bit lines that are coupled to the memory cells while each of the page buffers PB1 to PBm is sensing, through a sensing node, a change in the amount of flowing current based on the program state of a corresponding memory cell and latching it as sensing data. The read and write circuit 130 may be operated based on page buffer control signals that are outputted from the control logic 140.

During a read operation, the read and write circuit 130 may sense data that is stored in the memory cells and may temporarily store read data. Then, the read and write circuit 130 may output data DATA to the input/output buffer (not illustrated) of the semiconductor memory device 100. In an embodiment, the read and write circuit 130 may include a column select circuit, or the like, as well as the page buffers (or page register).

The control logic 140 may be coupled to the address decoder 120, the read and write circuit 130, and the voltage generator 150. The control logic 140 may receive a command CMD and a control signal CTRL through the input/output buffer (not illustrated) of the semiconductor memory device 100. The control logic 140 may control the overall operation of the semiconductor memory device 100 based on the control signal CTRL. The control logic 140 may output a control signal that controls a precharge potential level at the sensing node of the plurality of page buffers PB1 to PBm. The control logic 140 may control the read and write circuit 130 to perform a read operation of the memory cell array 110.

The voltage generator 150 may generate a read voltage Vread and a pass voltage Vpass that are required for a read operation based on a control signal that is outputted from the control logic 140. The voltage generator 150 may include a plurality of pumping capacitors that receive an internal supply voltage to generate a plurality of voltages with various voltage levels and may generate a plurality of voltages by selectively enabling the plurality of pumping capacitors based on the control logic 140.

The address decoder 120, the read and write circuit 130, and the voltage generator 150 may function as peripheral circuits that perform a read operation, a write operation, and an erase operation on the memory cell array 110. The peripheral circuits may perform a read operation, a write operation, and an erase operation on the memory cell array 110 based on the control logic 140.

Figure 2:
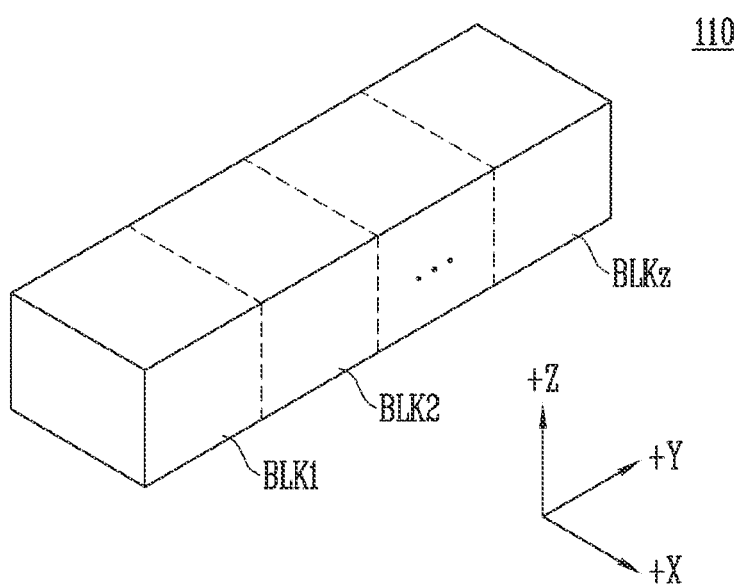
FIG. 2 is a diagram, illustrating an embodiment of a memory cell array of FIG. 1.

FIG. 2 is a diagram, illustrating an embodiment of the memory cell array of FIG. 1.

Referring to FIG. 2, the memory cell array 110 may include a plurality of memory blocks BLK1 to BLKz. Each memory block may have a three-dimensional (3D) structure. Each memory block may include a plurality of memory cells stacked on a substrate. Such memory cells may be arranged along a positive X (+X) direction, a positive Y (+Y) direction, and a positive Z (+Z) direction. The structure of each memory block will be described in detail below with reference to FIGS. 3 and 4.

Figure 3:
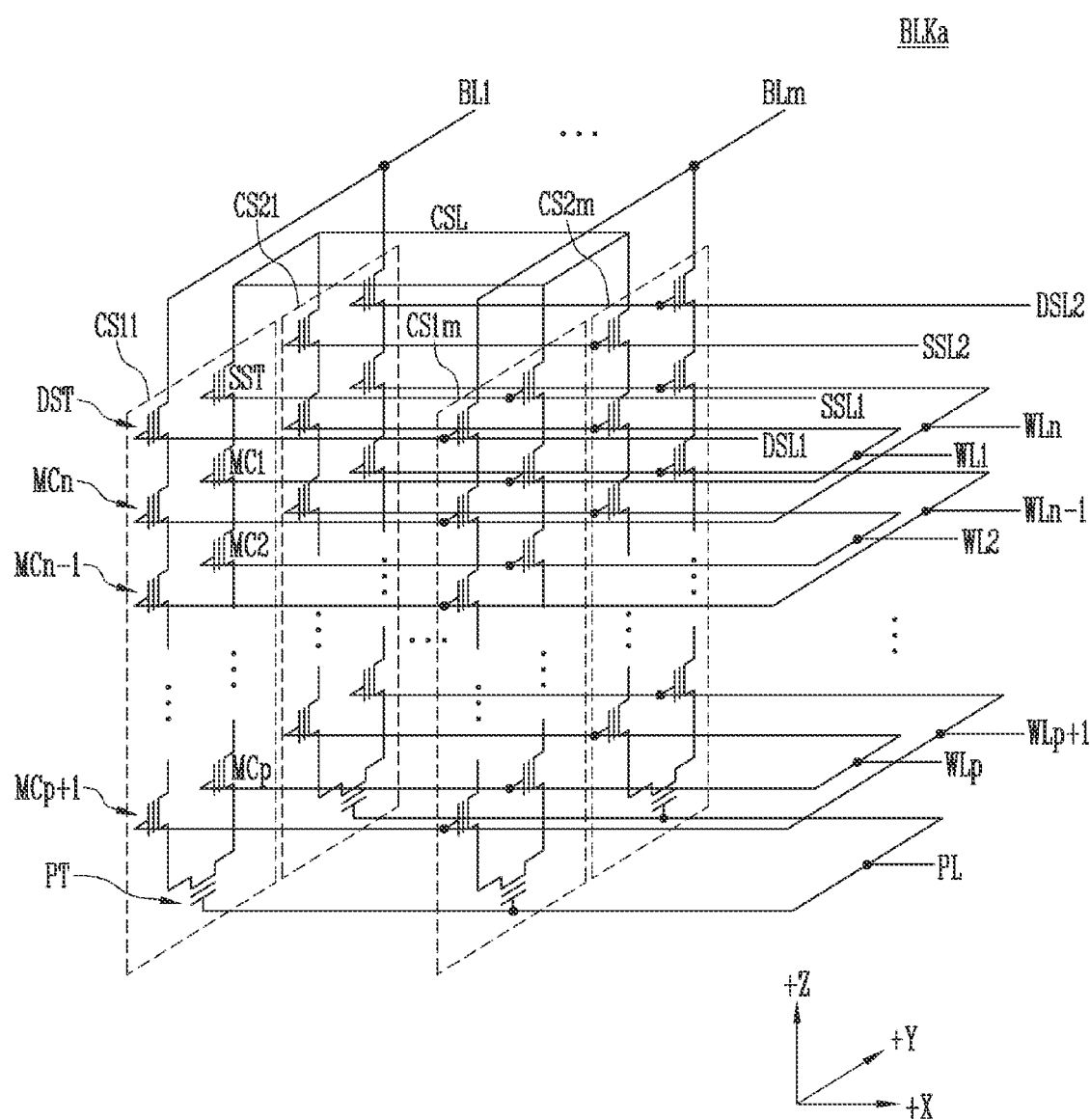
FIG. 3 is a circuit diagram, illustrating any one memory block BLKa of memory blocks BLK1 to BLKz of FIG. 2.

FIG. 3 is a circuit diagram, illustrating any one memory block BLKa of the memory blocks BLK1 to BLKz of FIG. 2.

Referring to FIG. 3, the memory block BLKa may include a plurality of cell strings CS11 to CS1m and CS21 to CS2m. In an embodiment, each of the cell strings CS11 to CS1m and CS21 to CS2m may be formed in a 'U' shape. In the memory block BLKa, m cell strings may be arranged in a row direction (i.e. a positive (+) X direction). In FIG. 3, two cell strings are illustrated as being arranged in a column direction (i.e. a positive (+) Y direction). However, this illustration is made for convenience of description, and it will be understood that three or more cell strings may be arranged in the column direction.

Each of the plurality of cell strings CS11 to CS1m and CS21 to CS2m may include at least one source select transistor SST, first to n-th memory cells MC1 to MCn, a pipe transistor PT, and at least one drain select transistor DST.

The select transistors SST and DST and the memory cells MC1 to MCn may have similar structures, respectively. In an embodiment, each of the select transistors SST and DST and the memory cells MC to MCn may include a channel layer, a tunneling insulating layer, a charge storage layer, and a blocking insulating layer. In an embodiment, a pillar that provides the channel layer may be provided to each cell string. In an embodiment, a pillar that provides at least one of the channel layer, the tunneling insulating layer, the charge storage layer, and the blocking insulating layer may be provided to each cell string.

The source select transistor SST of each cell string may be connected between the common source line CSL and memory cells MC1 to MCp.

In an embodiment, the source select transistors of cell strings that are arranged in the same row may be coupled to a source select line that is extended in a row direction, and source select transistors of cell strings that are arranged in different rows may be coupled to different source select lines. In FIG. 3, source select transistors of cell strings CS11 to CS1m in a first row may be coupled to a first source select line SSL1. The source select transistors of cell strings CS2I to CS2m in a second row may be coupled to a second source select line SSL2.

In an embodiment, source select transistors of the cell strings CS11 to CS1m and CS21 to CS2m may be coupled in common to a single source select line.

The first to n-th memory cells MC1 to MCn in each cell string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a negative Z (−Z) direction and may be connected in series between the source select transistor SST and the pipe transistor PT. The p+1-th to nth memory cells MCp+1 to MCn may be sequentially arranged in the positive Z (+Z) direction and may be connected in series between the pipe transistor PT and the drain select transistor DST. The first to p-th memory cells MC1 to MCp and the p+1-th to n-th memory cells MCp+1 to MCn may be coupled to each other through the pipe transistor PT, The gates of the first to nth memory cells MC1 to MCn of each cell string may be coupled to first to nth word lines WL1 to WLn, respectively.

The gate of the pipe transistor PT of each cell string may be coupled to a pipeline PL.

The drain select transistor DST of each cell string may be connected between the corresponding bit line and the memory cells MCp+1 to MCn. The cell strings arranged in different rows may be coupled to different drain select lines that are extended in a row direction. Drain select transistors of cell strings CS11 to CS1m in the first row may be coupled to a first drain select line DSL1. Drain select transistors of cell strings CS21 to CS2m in a second row may be coupled to a second drain select line DSL2.

Cell strings that are arranged in a different columns may be coupled to bit lines extended in a column direction. In FIG. 3, cell strings CS11 and CS21 in a first column may be coupled to a first bit line BL1, Cell strings CS1m and CS2m in an m-th column may be coupled to an m-th bit line BLm.

The memory cells that are coupled to the same word line in cell strings that are arranged in a same row may constitute a single page. For example, memory cells that are coupled to the first word line WL1, among the cell strings CS11 to CS1m in the first row, may constitute a single page. Memory cells that are coupled to the first word line WL1, among the cell strings CS21 to CS2m in the second row, may constitute an addditional single page. Cell strings that are arranged in a single row may be selected by selecting one of the drain select lines DSL1 and DSL2. A single page may be selected from the selected cell strings by selecting one of the word lines WL1 to WLn.

In an embodiment, even bit lines and odd bit lines, instead of first to m-th bit lines BL1 to BLm, may be provided. Further, even-numbered cell strings, among the cell strings CS1I to CS1m or CS21 to CS2m arranged in a row direction, may be coupled to the even bit lines, respectively, and odd-numbered cell strings, among the cell strings CS11 to CS1m or CS21 to CS2m that are arranged in the row direction, may be coupled to the odd bit lines, respectively.

In an embodiment, one or more of the first to n-th memory cells MC1 to MCn may be used as dummy memory cells. For example, one or more dummy memory cells may be provided to reduce an electric field between the source select transistor SST and the memory cells MC1 to MCp. Alternatively, the one or more dummy memory cells may be provided to reduce an electric field between the drain select transistor DST and the memory cells MCp+1 to MCn. As more dummy memory cells are provided, the reliability of the operation of the memory block BLKa may be improved, but the size of the memory block BLKa may increase. As fewer memory cells are provided, the size of the memory block BLKa may be reduced, but the reliability of the operation of the memory block BLKa may deteriorate.

In order to efficiently control the one or more dummy memory cells, each of the dummy memory cells may have a required threshold voltage, Before or after the erase operation of the memory block BLKa is performed, a program operation may be performed on all or some of the dummy memory cells. When an erase operation is performed after the program operation has been performed, the threshold voltages of the dummy memory cells may control the voltages that are applied to the dummy word lines that are coupled to respective dummy memory cells, and thus, the dummy memory cells may have required threshold voltages.

Figure 4:
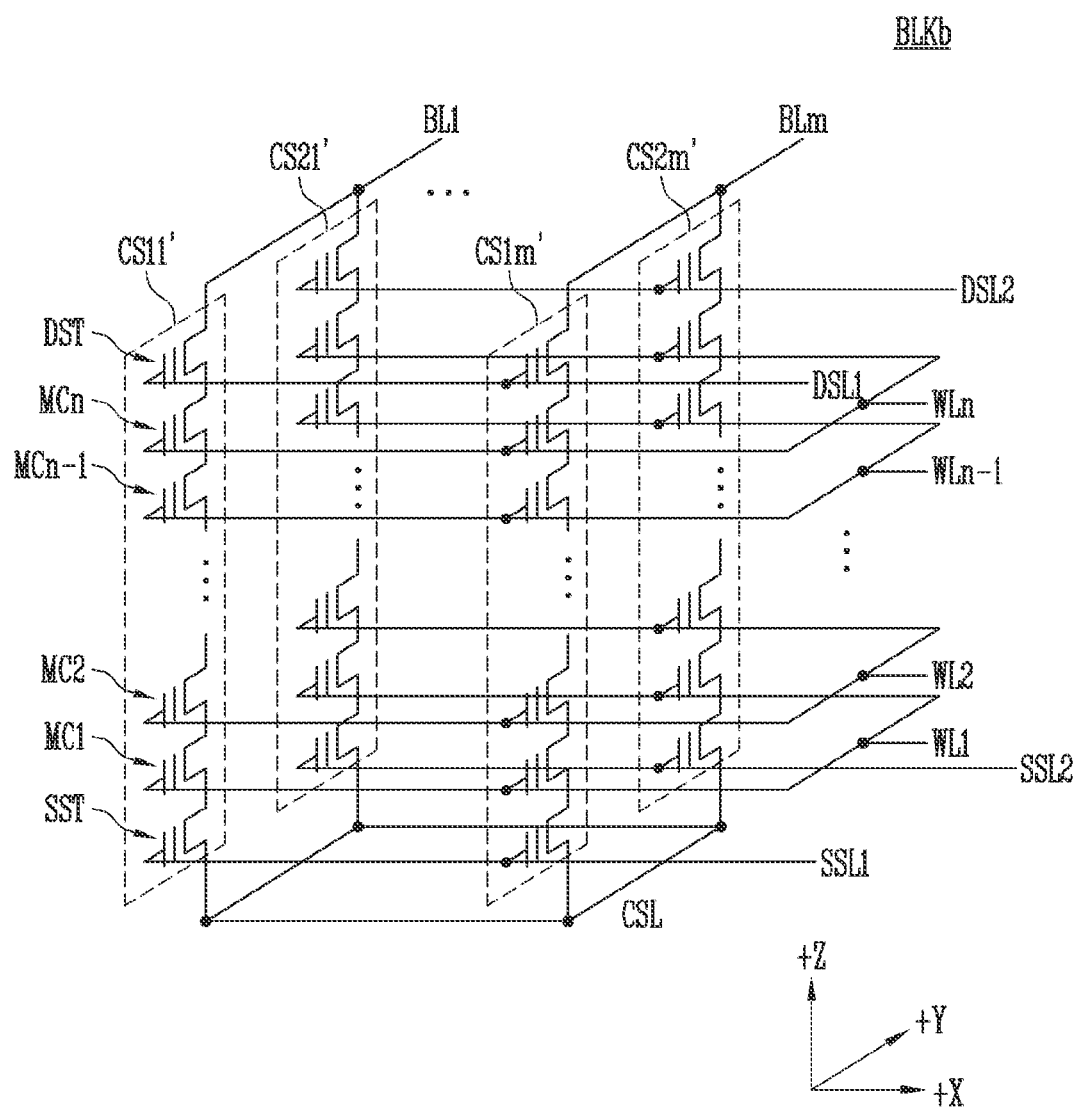
FIG. 4 is a circuit diagram, illustrating an example of any one memory block BLKb of the memory blocks BLK1 to BLKz of FIG. 2.

FIG. 4 is a circuit diagram, illustrating an example of any one memory block BLKb of the memory blocks BLK1 to BLKz of FIG. 2.

Referring to FIG. 4, the memory block BLKb may include a plurality of cell strings CS11' to CS1m' and CS21' to CS2m'. Each of the plurality of cell strings CS11' to CS1m' and CS21' to CS2m' may be extended along a positive Z (+Z) direction. Each of the cell strings CS11' to CS1m' and CS21' to CS2m' may include at least one source select transistor SST, first to nth memory cells MC1 to MCn, and at least one drain select transistor DST, which are stacked on a substrate (not illustrated) below the memory block BLKb.

The source select transistor SST of each cell string may be connected between a common source line CSL and memory cells MC1 to MCn. The source select transistors of cell strings that are arranged in the same row may be coupled to the same source select line. Source select transistors of cell strings CS11' to CS1m' that are arranged in a first row may be coupled to a first source select line SSL1. Source select transistors of cell strings CS21' to CS2m' that are arranged in a second row may be coupled to a second source select line SSL2. In an embodiment, source select transistors of the cell strings CS11' to CS1m' and CS21' to CS2m' may be coupled in common to a single source select line.

The first to n-th memory cells MC1 to MCn in each cell string may be connected in series between the source select transistor SST and the drain select transistor DST. The gates of the first to nth memory cells MC1 to MCn may be coupled to first to n-th word lines WL1 to WLn, respectively.

The drain select transistor DST of each cell string may be connected between the corresponding bit line and the memory cells MC1 to MCn. Drain select transistors of cell strings that are arranged in different rows may be coupled to different drain select lines that are extended in a row direction. The drain select transistors of the cell strings CS11' to CS1m' in the first row may be coupled to a first drain select line DSL1. The drain select transistors of the cell strings CS21' to CS2m' in the second row may be coupled to a second drain select line DSL2.

As a result, the memory block BLKb of FIG. 4 has an equivalent circuit that is similar to the memory block BLKa of FIG. 3, except that a pipe transistor PT is excluded from each cell string.

In an embodiment, even bit lines and odd bit lines, instead of first to m-th bit lines BL1 to BLm, may be provided. Further, even-numbered cell strings, among the cell strings CS11' to CS1m' or CS21' to CS2m' that are arranged in a row direction, may be coupled to the even bit lines, respectively, and odd-numbered cell strings, among the cell strings CS11' to CS1m' or CS21' to CS2m' that are arranged in the row direction, may be coupled to the odd bit lines, respectively.

In an embodiment, one or more of the first to n-th memory cells MC1 to MCn may be used as dummy memory cells. For example, the one or more dummy memory cells may be provided to reduce an electric field between the source select transistor SST and the memory cells MC1 to MCn. Alternatively, the one or more dummy memory cells may be provided to reduce an electric field between the drain select transistor DST and the memory cells MC1 to MCn. As more dummy memory cells are provided, the reliability of the operation of the memory block BLKb may be improved, but the size of the memory block Kith may increase. As fewer memory cells are provided, the size of the memory block BLKb may be reduced, but the reliability of the operation of the memory block BLKb may deteriorate.

In order to efficiently control the one or more dummy memory cells, each of the dummy memory cells may have a required threshold voltage. Before or after the erase operation of the memory block BLKb is performed, a program operation may be performed on all or some of the dummy memory cells. When an erase operation is performed after the program operation has been performed, the threshold voltages of the dummy memory cells may control the voltages that are applied to the dummy word lines that are coupled to respective dummy memory cells, and thus, the dummy memory cells may have required threshold voltages.

Figure 5:
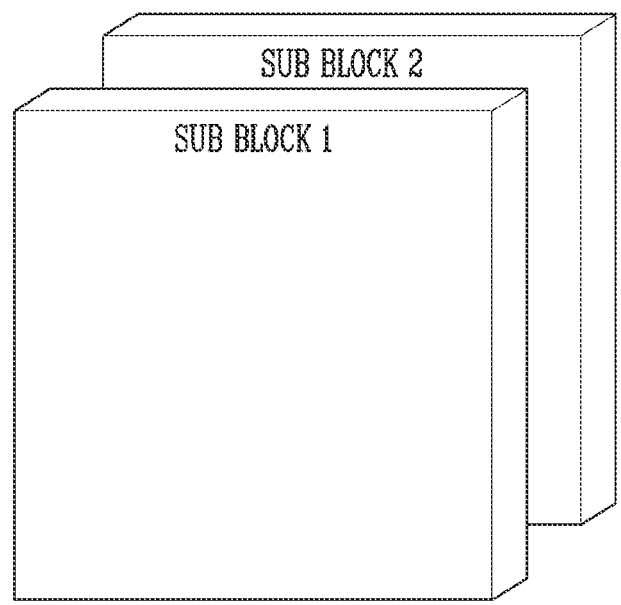
FIG. 5 is a diagram, illustrating an example of sub-blocks that form a memory block.

FIG. 5 is a diagram, illustrating an example of sub-blocks that form a memory block.

Referring to FIG. 5, sub-blocks SUB BLOCK 1 and SUB BLOCK 2, included in the memory block BLKa or BLKb, illustrated in FIG. 3 or 4 are illustrated. In an example, referring to FIG. 5, together with FIG. 3, the sub-blocks that are included in the memory block BLKa may be defined as cell strings that share a drain select line or a source select line. For example, in FIG. 3, the cell strings CS11 to CS1m that share the first drain select line DSL1 and the first source select line SSL1 may form the first sub-block SUB BLOCK 1, Meanwhile, the cell strings CS21 to CS2m that share the second drain select line DSL2 and the second source select line SSL2 may form the second sub-block SUB BLOCK 2.

Figure 6A:
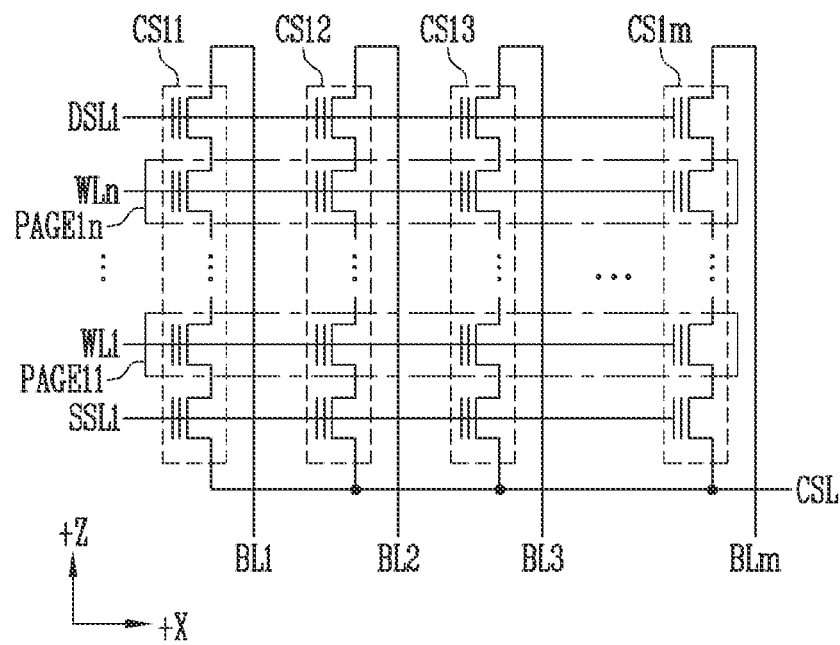
FIG. 6A is a circuit diagram, illustrating, in detail, a first sub-block, among the sub-blocks, illustrated in FIG. 5.
Figure 6B:
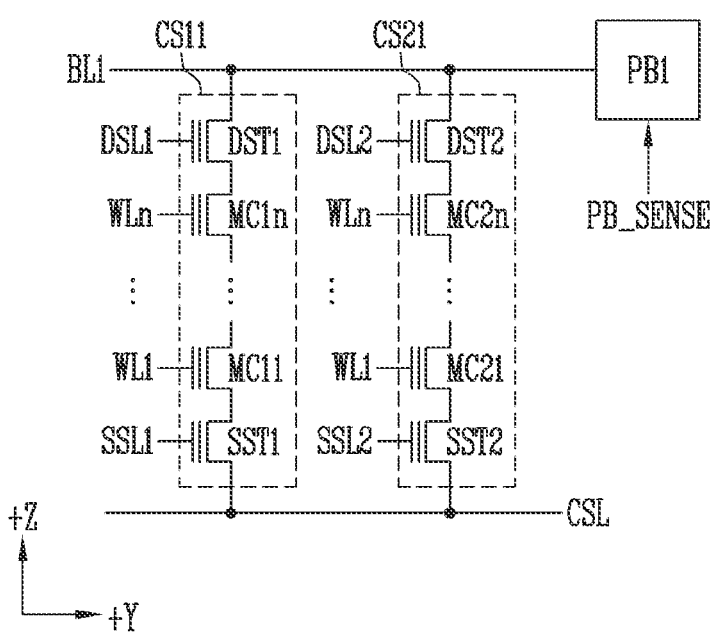
FIG. 6B is a circuit diagram, illustrating some of cell strings, included in the first and second sub-blocks.

In an example, in FIG. 4, the cell strings CS11' to CS1m' that share the first drain select line DSL1 and the first source select line SSL1 may form the first sub-block SUB BLOCK 1. Meanwhile, the cell strings CS21' to CS2m' that share the second drain select line DSL2 and the second source select line SSL2 may form the second sub-block SUB BLOCK 2. The memory block may include two sub-books SUB BOCK 1 and SUB BLOCK 2 that are arranged in a +Y direction, Each of the sub-blocks SUB BLOCK 1 and SUB BLOCK 2 may include cell strings that are arranged in a row direction (i.e., a +X direction). Meanwhile, each of the sub-blocks SUB BLOCK 1 and SUB BLOCK 2 may include pages that are arranged in a string direction (i.e., a +Z direction). Detailed configuration of each sub-block will be described below with reference to FIGS. 6A and 6B, FIG. 6A is a circuit diagram, illustrating in detail a first sub-block, among the sub-blocks, illustrated in FIG. 5. Since the second sub-block may be configured in the same manner as the first sub-block, a detailed circuit diagram of the second sub-block is omitted here.

Referring to FIG. 6A, the first sub-block SUB BLOCK 1 may include cell strings CS11 to CS1m that share a first drain select line DSL1 and a first source select line SSL1. That is, the cell strings CS11 to CS1m that are included in the first sub-block SUB BLOCK 1 may be coupled in common to the first drain select line DSL1 and the first source select line SSL1. The cell strings CS11 to CS1m may be arranged in a +X direction in the first sub-block SUB BLOCK 1. The cell strings CS11 to CS1m may be coupled to corresponding bit lines BL1 to BLm, respectively.

Meanwhile, the first sub-block SUB BLOCK 1 may include pages PAGE11 to PAGE1n that are arranged in a +Z direction. Each of the pages PAGE11 to PAGE1n may be a set of memory cells that are coupled to a corresponding one of word line WL1 to WLn.

Although not illustrated in FIG. 6A, the second sub-block SUB BLOCK 2 may also include cell strings CS21 to CS2m that are arranged in the +X direction. Meanwhile, the second sub-block SUB BLOCK 2 may include pages PAGE21 to PAGE2n that are arranged in the +Z direction.

FIG. 6B is a circuit diagram, illustrating some of cell strings, included in the first and second sub-blocks.

Referring to FIG. 6B, the cell string CS11 that are included in the first sub-block SUB BLOCK 1 and the cell string CS21 that are included in the second sub-block SUB BLOCK 2 are illustrated, FIG. 6B is a circuit diagram, illustrating the memory block of FIG. 5 in a +Y direction. Therefore, in FIG. 6B, the cell strings CS12 to CS1m that are included in the first sub-block SUB BLOCK 1 and the cell strings CS22 to CS2m that are included in the second sub-block SUB BLOCK 2 are not illustrated.

The cell string CS11 in the first sub-block SUB BLOCK 1 may include memory cells MC11 to MC1n that are coupled between a first drain select transistor DST1 and a first source select transistor SST1. The cell string CS21 in the second sub-block SUB BLOCK 2 may include memory cells MC21 to MC2n that are coupled between a second drain select transistor DST2 and a second source select transistor SST2.

The cell string CS11 that is included in the first sub-block SUB BLOCK 1 and the cell string CS21 that is included in the second sub-block SUB BLOCK 2 may be coupled in common to a bit line BL1. Meanwhile, a page buffer PB1 may be coupled in common to the bit line BL1. That is, the cell string CS11 that is included in the first sub-block SUB BLOCK 1 and the cell string CS21 that is included in the second sub-block SUB BLOCK 2 may share the page buffer PB1.

Figure 7:
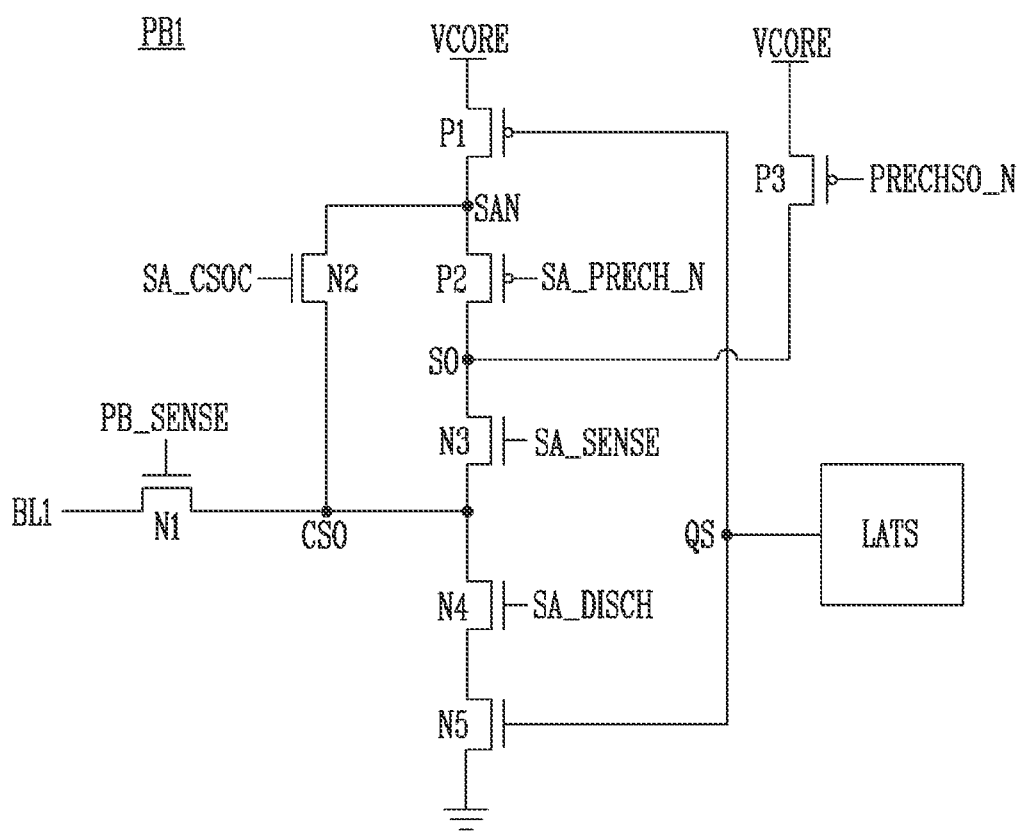
FIG. 7 is a circuit diagram, illustrating a page buffer PB1 that is included in a semiconductor memory device 100, according to an embodiment of the present disclosure.

FIG. 7 is a circuit diagram, illustrating a page buffer PB1 that is included in a semiconductor memory device 100, according to an embodiment of the present disclosure. The page buffer, illustrated in FIG. 7, may be one of the page buffers PB1 to PBm that are included in the read and write circuit 130 of FIG. 1. Since the plurality of page buffers PB1 to PBm that are included in the read and write circuit 130 may be configured in a similar manner, one of the page buffers is described by way of example.

The page buffer may be operated based on a signal output from a control logic 140. Signals PB_SENSE, SA_PRECH_N, SA_SENSE, SA_CSOC, SA_DISCH, and PRECHSO_N, which will be described below, may be included in control signals CTRPB output from the control logic 140. The page buffer PB1 will be described in detail below.

Referring to FIG. 7, the page buffer PB1 may be coupled to a memory cell through a bit line BL1 and may perform a bit line precharge operation of charging the bit line BL1 with charges, supplied from a supply voltage source VCORE through first to fifth NMOS transistors N1 to N5 and first to third PMOS transistors P1 to P3, Also, the page buffer PB1 may discharge the bit line BL1, charged with the charges, to a ground voltage through the first NMOS transistor N1, the fourth NMOS transistor N4, and the fifth NMOS transistor N5.

The first NMOS transistor N1 may be coupled between the bit line BL1 and a common node CSO. The first PMOS transistor P1 may be coupled between the supply voltage source VCORE and a sense amplifier (AMP) node SAN. The second NMOS transistor N2 may be coupled between the common node CSO and the sense AMP node SAN. The second PMOS transistor P2 may be coupled between the sense AMP node SAN and a sensing node SO. The third NMOS transistor N3 may be coupled between the sensing node SO and the common node CSO. The third PMOS transistor P3 may be coupled between the supply voltage source VCORE and the sensing node SO. The fourth and fifth NMOS transistors N4 and N5 may be coupled in series between the common node CSO and a ground voltage source.

The first NMOS transistor N1 may be controlled based on a page buffer sensing signal PB_SENSE, the second NMOS transistor N2 may be controlled based on a current sensing signal SA_CSOC, and the third NMOS transistor N3 may be controlled based on a sense AMP sensing signal SA_SENSE. Further, the fourth NMOS transistor N4 may be controlled based on a sense AMP discharge signal SA_DISCH, and the fifth NMOS transistor N5 and the first PMOS transistor P1 may be controlled based on the voltage of a node QS of a sensing latch circuit LATS. The second PMOS transistor P2 may be controlled based on a sense AMP precharge signal SA_PRECH_N, and the third PMOS transistor P3 may be controlled based on a sensing node precharge signal PRECHSO_N. That is, the page buffer sensing signal PB_SENSE may be applied to a gate of the first NMOS transistor N1, the current sensing signal SA_CSOC may be applied to a gate of the second NMOS transistor N2, and the sense AMP sensing signal SA_SENSE may be applied to a gate of the third NMOS transistor N3. Further, the sense AMP discharge signal SA_DISCH may be applied to a gate of the fourth NMOS transistor N4, and the voltage of the node QS of the sensing latch circuit LATS may be applied to gates of the fifth NMOS transistor N5 and the first PMOS transistor P1. The sense AMP precharge signal SA_PRECH_N may be applied to a gate of the second PMOS transistor P2, and the sensing node precharge signal PRECHSO_N may be applied to a gate of the third PMOS transistor P3.

The sensing latch circuit LATS may include a latch that is composed of two inverters (not illustrated) that are coupled to the node QS, and a reset transistor (not illustrated) and a set transistor (not illustrated) that control the voltage of the node QS. Since the structure of the sensing latch circuit LATS is widely known, a detailed configuration thereof will be omitted in FIG. 7.

Figure 8:
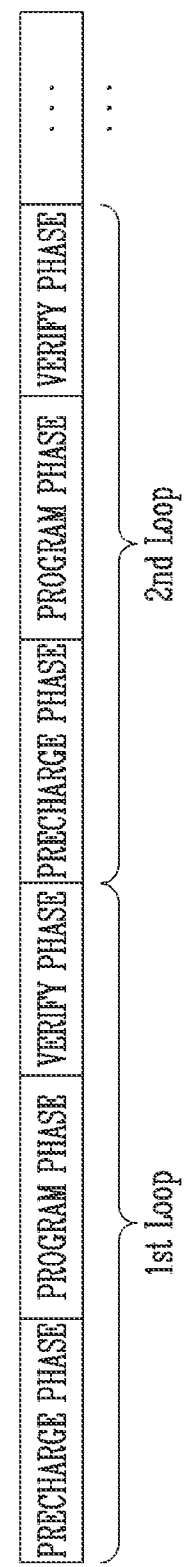
FIG. 8 is a diagram, illustrating a program operation of a semiconductor memory device, according to an embodiment of the present disclosure.

FIG. 8 is a diagram, illustrating a program operation of a semiconductor memory device, according to an embodiment of the present disclosure.

Referring to FIG. 8, the program operation of the semiconductor memory device may include a plurality of program loops. Each loop may include a precharge phase, a program phase, and a verify phase.

In the precharge phase, an operation of setting a bit line voltage of a sub-block that is a program target in the memory block may be performed, and a string precharge operation on a sub-block, other than the program target, in the memory block may be performed.

The operation of setting the bit line voltage of the sub-block that is the program target may include an operation of setting the bit line voltage to a program permission voltage or a program inhibition voltage to program data to pages indicating the program target in the corresponding sub-block. When a program pulse is applied to a selected word line in a subsequent program phase, a threshold voltage of a memory cell that is coupled to the bit line that is set to the program permission voltage may be moved. Meanwhile, in the subsequent program phase, a threshold voltage of a memory cell that is coupled to a bit line that is set to the program inhibition voltage might not be moved.

In an embodiment, the program permission voltage may be a ground voltage. In the structure of the page buffer PB1 such as that illustrated in FIG. 7, the ground voltage may be transferred to the bit line BL1 through the fifth NMOS transistor N5, the fourth NMOS transistor N4, and the first NMOS transistor N1.

In an embodiment, the program inhibition voltage may be a supply voltage VCORE. In this case, in the structure of the page buffer PB1, such as that illustrated in FIG. 7, the supply voltage VCORE may be transferred to the bit line BL1 through the first PMOS transistor P1, the second NMOS transistor N2, and the first NMOS transistor N1. In an embodiment, the supply voltage VCORE may be transferred to the bit line BL1 through the first PMOS transistor P1, the second PMOS transistor P2, the third NMOS transistor N3, and the first NMOS transistor N1.

In both cases, one case in which the program permission voltage is transferred to the bit line and another case which the program inhibition voltage is transferred to the bit line, the first NMOS transistor N1 may be turned on, and thus, the corresponding voltages may be transferred to the bit line. That is, the operation of setting the bit line voltage may be performed by increasing the page buffer sensing signal PB_SENSE that is applied to the page buffers PB1 to PBm from a turn-off voltage to a turn-on voltage.

The string precharge operation on the sub-block, other than the program target, may include an operation of transferring a voltage that is applied from the common source line to strings that are included in an unselected sub-block. As illustrated in FIGS. 3 and 4, since different sub-blocks are coupled in common to the selected word line, memory cells that are included in the unselected sub-block may also be influenced by a program pulse that is applied to the word line during a program operation on the selected sub-block.

For example, in the structure of the memory block illustrated in FIGS. 5 to 6B, the case in which the page PAGE 11 with the memory cell MC11 that is included in the cell string CS11 is programmed is taken into consideration. In this case, the first sub-block SUB BLOCK 1 may correspond to a sub-block that is selected as the program target, and the second sub-block SUB BLOCK 2 may correspond to an unselected sub-block. When the page PAGE 11 is programmed, a program pulse may be applied to the first word line WL1. The cell string CS21 that is included in the unselected sub-block may also be coupled to the first word line WL1. Therefore, when the program pulse is applied to the first word line WL1 in the case in which a channel voltage of the memory cell MC21 is low, a problem may arise in which a threshold voltage of the memory cell MC21 is moved. Therefore, when a sub-block with the cell strings CS11 to CS1m is selected as the program target, the problem in which threshold voltages of memory cells that are included in the unselected sub-block are unintentionally moved may be prevented by sufficiently increasing, in advance, the channel voltages of the cell strings that are included in the unselected sub-block, for example, the cell strings CS21 to CS2m. This operation may be referred to as a "string precharge operation".

In accordance with the semiconductor memory device 100, according to an embodiment of the present disclosure, an operation of setting a bit line voltage to program a page that is included in a selected sub-block and a string precharge operation on an unselected sub-block may be performed in a precharge phase that is included in each loop.

In the program phase, threshold voltages of memory cells that are included in the selected page may be selectively moved by applying a program pulse to a selected word line and applying a program pass voltage to an unselected word line. In this case, the threshold voltages of memory cells that are included in the selected page may be moved or maintained based on respective bit line voltages that are set in the precharge phase. That is, the threshold voltage of a memory cell that is coupled to a bit line to which a program permission voltage is designated to be applied in the precharge phase may be moved as the program pulse is applied to the selected word line. Further, the threshold voltage of a memory cell that is coupled to a bit line to which a program inhibition voltage is designated to be applied in the precharge phase might not be moved even if the program pulse is applied to the selected word line.

In the verify phase, whether memory cells that are included in the selected page have been programmed to target program states may be checked through a verify voltage. When the threshold voltages of memory cells of a predetermined proportion or more, among the memory cells that are included in the selected page, have reached target levels, the program operation may be completed. In this case, a subsequent loop might not be executed, and the program operation may be terminated. When the proportion of memory cells, the threshold voltages of which have reached the target levels, among the memory cells included in the selected page, is less than the predetermined proportion, the program operation might not be terminated, and a subsequent loop may be executed.

Figure 9:
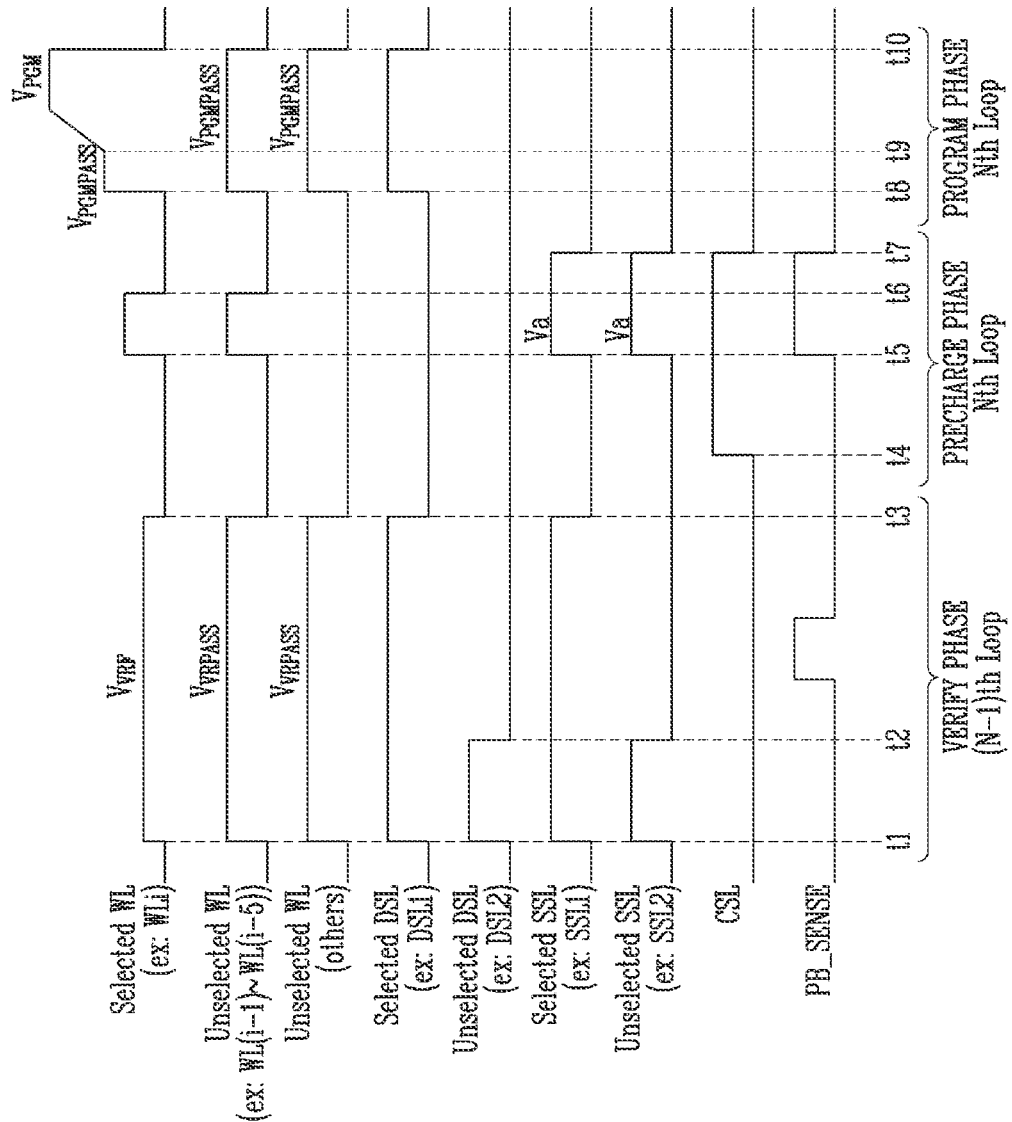
FIG. 9 is a timing diagram, illustrating in detail a program operation of a semiconductor memory device, according to an embodiment of the present disclosure.

FIG. 9 is a timing diagram, illustrating, in detail, a program operation of a semiconductor memory device, according to an embodiment of the present disclosure. In FIG. 9, a verify phase in an (N−1)-th program loop, and a precharge phase and a program phase in an N-th program loop are illustrated, Referring to FIG. 9, the case in which, of first and second sub-blocks included in a memory block, the first sub-block is selected as a program target is illustrated. In detail, the case in which, among memory cells included in the first sub-block, memory cells that are coupled to an i-th word line WLi are selected as program target memory cells is illustrated in FIG. 9.

In FIG. 9, voltages that are applied to the selected i-th word line, voltages that are applied to (i−5)-th to (i−1)-th word lines WL(i−5) to WL(i−1), arranged adjacent to the selected i-th word line WLi, among unselected word lines, and voltages that are applied to the remaining unselected word lines (others) are illustrated. Further, voltages that are applied to a first drain select line DSL1 that is coupled to the selected first sub-block SUB BLOCK 1 and voltages that are applied to an unselected second drain select line DSL2 are illustrated. Furthermore, voltages that are applied to a first source select line SSL1 that is coupled to the selected first sub-block SUB BLOCK 1 and voltages that are applied to an unselected second source select line SSL2 are illustrated. Meanwhile, the voltage of a common source line CSL and the voltage of a page buffer sensing signal PB_SENSE are illustrated.

At time t1 in the verify phase, a verify voltage $V_{VRF}$ may be applied to the selected word line WLi and a verify pass voltage $V_{VRPASS}$ may be applied to unselected word lines. Meanwhile, a turn-on voltage may be applied to the drain select lines DSL1 and DSL2 and the source select lines SSL1 and SSL2. At subsequent time t2, a turn-off voltage may be applied to the unselected drain select line DSL2 and the unselected source select line SSL2, During at least a part of an interval between time t2 and time t3, the page buffer sensing signal PB_SENSE may be enabled to a turn-on voltage, and thus, the threshold voltages of the selected memory cells may be sensed. At subsequent time t3, the verify operation may be terminated. Accordingly, a turn-off voltage may be applied to the word lines, the drain select lines, and the source select lines.

At time t4 in the precharge phase, the voltage of the common source line may increase. At this time, the voltage that is applied to the common source line may be a voltage for precharging the strings that are included in the unselected sub-block. At subsequent time t5, a string precharge operation may be performed by increasing the voltages of the selected first source select line SSL1 and the unselected second source select line SSL2 to a voltage level Va. In the embodiment illustrated in FIG. 9, not only strings that are included in the unselected sub-block but also strings that are included in the selected sub-block may be precharged. The turn-on voltage may be applied to the selected word line WLi and the word lines WL(i−5) to WL(i−1) that are adjacent thereto at time t5 so that the string precharge operation may smoothly progress. At subsequent time t6, a turn-off voltage may be applied to the selected word line WLi and the word lines WL(i−5) to WL(i−1) that are adjacent thereto.

Meanwhile, at time t5 in the precharge phase, the operation of setting the bit line voltage may be performed simultaneously with the string precharge operation. Accordingly, as described above, a program permission voltage or a program inhibition voltage may be applied to the bit lines BL1 to BLm by increasing the page buffer sensing signal PB_SENSE to the turn-on voltage.

At time t7, the string precharge operation and the bit line voltage setting operation may be terminated. Accordingly, the voltage that is applied to the source select lines may decrease to a turn-off voltage, and the voltage of the page buffer sensing signal PB_SENSE may also decrease to a turn-off voltage.

At time t8 in the program phase, the voltages of the word lines may increase to a program pass voltage $V_{PGMPASS}$. Also, the voltage of the first drain select line DSL1 that is coupled to the first sub-block SUB BLOCK 1, which is the selected sub-block, may increase to a turn-on voltage. The voltage of the second drain select line DSL2 that is coupled to the unselected second sub-block SUB BLOCK 2 may be maintained at a turn-off voltage.

At time t9, the voltage of the selected i-th word line WLi, among the word lines, may increase to a program voltage $V_{PGM}$. The voltages of the remaining word lines, that is, the unselected word lines, may be maintained at the program pass voltage $V_{PGMPASS}$. The program voltage $V_{PGM}$ that is applied to the selected i-th word line WLi may be maintained to time t10. At time t10, the program phase may be terminated.

Referring to FIG. 9, the string precharge operation may be performed by increasing the voltages of the selected first source select line SSL1 and the unselected second source select line SSL2 to the voltage level Va and by applying the increased voltages at time t5, and the bit line voltage setting operation may be performed by increasing the page buffer sensing signal PB_SENSE to a turn-on voltage. That is, at time t5, the string precharge operation and the bit line voltage setting operation may be simultaneously performed. Here, the current that is required for the string precharge operation and the current required for the bit line voltage setting operation may be simultaneously consumed. Accordingly, a problem may arise when the current that is consumed by the semiconductor memory device 100 sharply increases.

In accordance with a semiconductor memory device according to other embodiments of the present disclosure, the semiconductor memory device may be controlled such that the string precharge operation and the bit line voltage setting operation start at different time points. In this case, the current that is consumed by the semiconductor memory device 100 may be temporally dispersed, and thus, the above-described problem may be solved.

Figure 10:
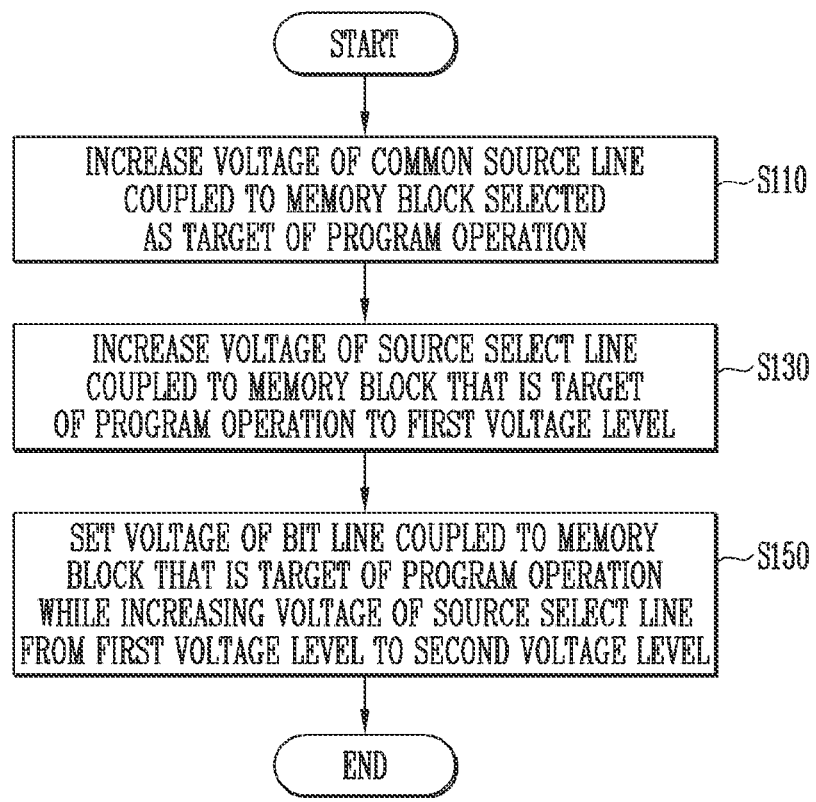
FIG. 10 is a flowchart, illustrating a method of operating a semiconductor memory device, according to an embodiment of the present disclosure.

FIG. 10 is a flowchart, illustrating a method of operating a semiconductor memory device, according to an embodiment of the present disclosure. Referring to FIG. 10, based on the method of operating a semiconductor memory device according to an embodiment of the present disclosure, the voltage of a common source line that is coupled to a memory block that is selected as the target of a program operation may increase at step S110, the voltage of a source select line that is coupled to the memory block that is the target of the program operation may increase to a first voltage level at step S130, and the voltage of a bit line that is coupled to the memory block that is the target of the program operation may be set while the voltage of the source select line is increasing from the first voltage level to a second voltage level at step S150. The method, illustrated in FIG. 10, is performed in the precharge phase, illustrated in FIGS. 8 and 9.

That is, in the state in which the voltage of the common source line increases at step S110, the voltage of the source select line may first increase to the first voltage level at step S130. At subsequent step S150, the bit line voltage setting operation may be performed while the voltage of the source select line is increasing from the first voltage level to the second voltage level. Accordingly, the current that is consumed by the string precharge operation at steps S130 and S150 may be dispersed. Detailed embodiments of the method of operating the semiconductor memory device in FIG. 10 will be described below with reference to FIGS. 11 to 14.

Figure 11:
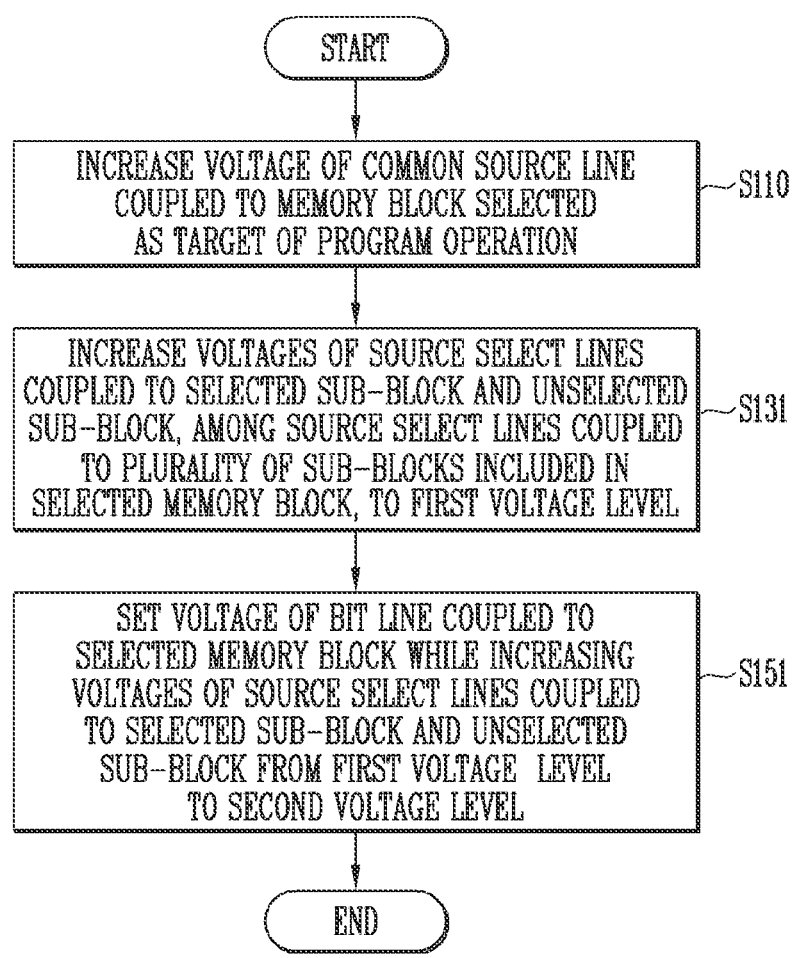
FIG. 11 is a flowchart, illustrating an embodiment of the method of operating a semiconductor memory device in FIG. 10.
Figure 12:
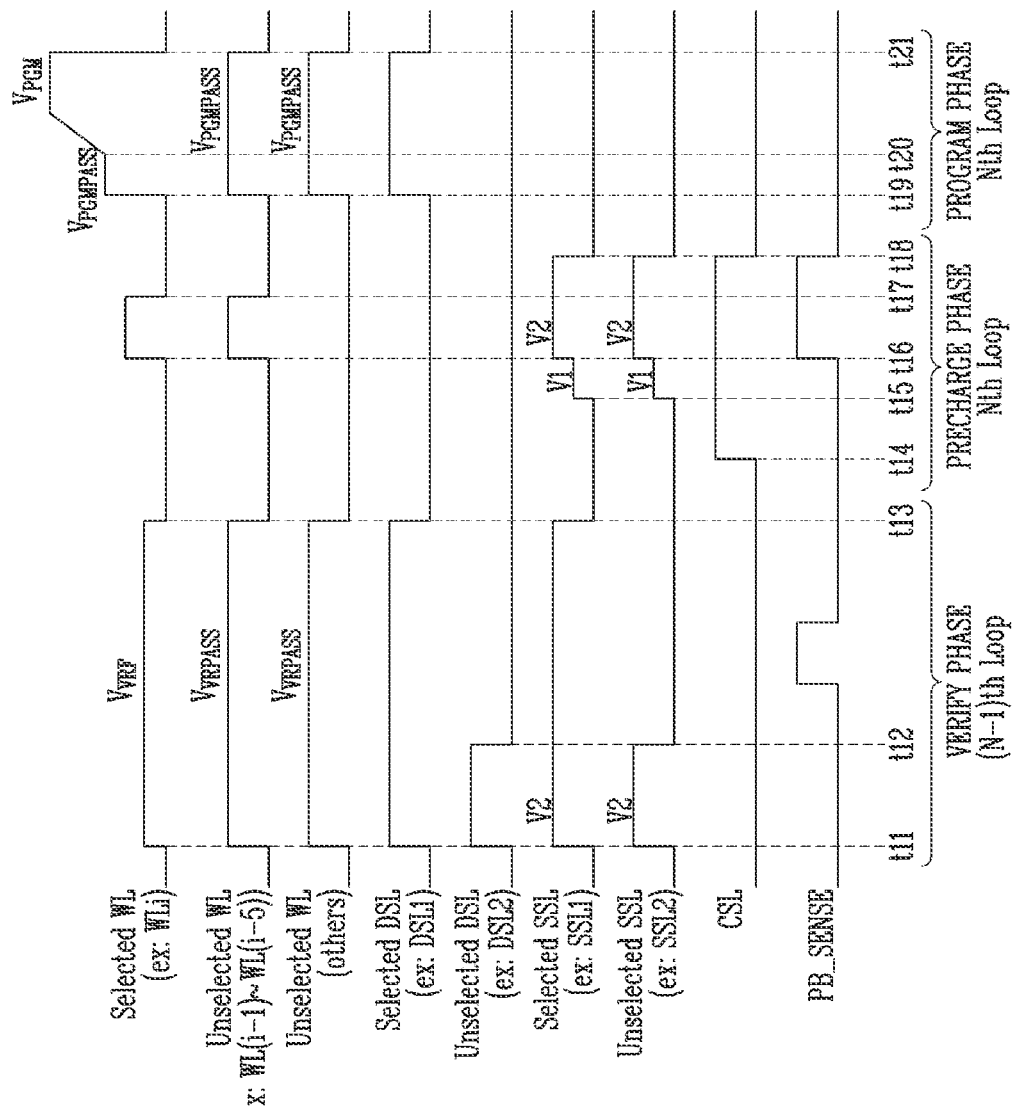
FIG. 12 is a timing diagram for explaining the embodiment of FIG. 11.

FIG. 11 is a flowchart, illustrating an embodiment of the method of operating a semiconductor memory device in FIG. 10. FIG. 12 is a timing diagram, explaining the embodiment of FIG. 11. Hereinafter, a description will be made with reference to FIGS. 11 and 12 together.

Referring to FIG. 11, based on the method of operating a semiconductor memory device according to an embodiment of the present disclosure, the voltage of a common source line that is coupled to a memory block that is selected as the target of a program operation may increase at step S110. Thereafter, the voltages of source select lines that are coupled to a sub-block that is selected as the program target and an unselected sub-block, among source select lines that are coupled to a plurality of sub-blocks that are included in the selected memory block, may increase to the first voltage level at step S131. That is, at step S131, the voltages of all source select lines that are coupled to the memory block may increase to the first voltage level. Thereafter, at step S151, the voltage of the bit line that is coupled to the selected memory block may be set while the voltages of the source select lines that are coupled to the selected sub-block and the unselected sub-block are increasing from the first voltage level to a second voltage level.

That is, in the state in which the voltage of the common source line increases at step S110, the voltages of all source select lines that are coupled to the memory block may first increase to the first voltage level at step S131. At subsequent step S151, the bit line voltage setting operation may be performed while the voltages of all source select lines are increasing from the first voltage level to the second voltage level. Accordingly, the current that is consumed by the string precharge operation at steps S131 and S151 may be dispersed.

Referring to FIG. 12, a verify phase in an (N−1)-th program loop and a precharge phase and a program phase in an N-th program loop are illustrated, Referring to FIG. 12, the case in which, of first and second sub-blocks that are included in a memory block, the first sub-block is selected as a program target is illustrated. In detail, the case in which, among memory cells that are included in the first sub-block, memory cells that are coupled to an i-th word line WLi are selected as program target memory cells is illustrated in FIG. 12.

At time t11 in the verify phase, a verify voltage $V_{VRF}$ may be applied to the selected word line WLi, and a verify pass voltage $V_{VRPASS}$ may be applied to unselected word lines, Meanwhile, the turn-on voltage may be applied to the drain select lines DSL1 and DSL2 and the source select lines SSL1 and SSL2. In an example, the turn-on voltage that is applied to the source select lines SSL1 and SSL2 may have a second voltage level V2. The second voltage level V2 may be substantially the same as the voltage level Va that is illustrated in FIG. 9. At subsequent time t12, a turn-off voltage may be applied to the unselected drain select line DSL2 and the unselected source select line SSL2. During at least a part of an interval between time t12 and time t13, a page buffer sensing signal PB_SENSE may be enabled to a turn-on voltage, and thus, the threshold voltages of the selected memory cells may be sensed. At subsequent time t13, the verify operation may be terminated. Accordingly, a turn-off voltage may be applied to the word lines, the drain select lines, and the source select lines.

At time t14 in the precharge phase, the voltage of the common source line may increase. This may correspond to step S110 of FIGS. 10 and 11. The voltage that is applied to the common source line may be a voltage for precharging the strings that are included in the unselected sub-block. At subsequent time t15, the voltages of the selected first source select line SSL1 and the unselected second source select line SSL2 may increase to the first voltage level V2. This may correspond to step S130 of FIG. 10 or step S131 of FIG. 11, Here, the first voltage level V1 may be a voltage for slightly turning on the source select transistors that are coupled to the common source line CSL.

At subsequent time t16, the voltages of the selected first source select line SSL1 and the unselected second source select line SSL2 may increase from the first voltage level V1 to the second voltage level V2. Meanwhile, a turn-on voltage may be applied to the selected word line WLi and the word lines WL(i−5) to WL(i−1) that are adjacent thereto at time t16 so that the string precharge operation may smoothly progress. At subsequent time t17, the turn-off voltage may be applied to the selected word line WLi and the word lines WL(i−5) to WL(i−1) that are adjacent thereto. In the embodiment, illustrated in FIG. 12, the turn-on voltage is illustrated as being applied to the selected word line WLi and the word lines WL(i−5) to WL(i−1) that are adjacent thereto at time t16 so that the string precharge operation smoothly progresses. However, in accordance with an embodiment, the turn-on voltage may be applied to the word lines at time t15 at which the voltages of the source select lines are increased to the first voltage level.

Meanwhile, at time t16 in the precharge phase, an operation of setting a bit line voltage may be performed. Accordingly, as described above, a program permission voltage or a program inhibition voltage may be applied to the bit lines BL1 to BLm by increasing the page buffer sensing signal PB_SENSE to the turn-on voltage.

At time t16, the operation of setting the bit line voltage by increasing the voltages of the selected first source select line SSL1 and the unselected second source select line 55L2 from the first voltage level V1 to the second voltage level V2 and by increasing the page buffer sensing signal PB_SENSE to a turn-on voltage may correspond to step S150 of FIG. 10 or step S151 of FIG. 11.

At time t18, the string precharge operation and the bit line voltage setting operation may be terminated. Accordingly, the voltage applied to the source select lines may decrease to the turn-off voltage, and the voltage of the page buffer sensing signal PB_SENSE may also decrease to the turn-off voltage.

At time t19 is in the program phase, the voltages of the word lines may increase to a program pass voltage $V_{PGMPASS}$. Also, the voltage of the first drain select line DSL1 that is coupled to the first sub-block SUB BLOCK 1, which is the selected sub-block, may increase to the turn-on voltage. The voltage of the second drain select line DSL2 that is coupled to the unselected second sub-block SUB BLOCK 2 may be maintained at the turn-off voltage.

At time t20, the voltage of the selected i-th word line WLi, among the word lines, may increase to a program voltage $V_{PGM}$. The voltages of the remaining word lines, that is, the unselected word lines, may be maintained at the program pass voltage $V_{PGMPASS}$. The program voltage $V_{PGM}$ that is applied to the selected i-th word line WLi may be maintained to time t21. At time t21, the program phase may be terminated.

In accordance with the embodiment, illustrated in FIGS. 11 and 12, the time at which current is to be consumed may be dispersed by increasing the voltage of the source select lines through a two-step process during the string precharge operation. Accordingly, the peak current to be used by the semiconductor memory device 100 may decrease.

Figure 13:
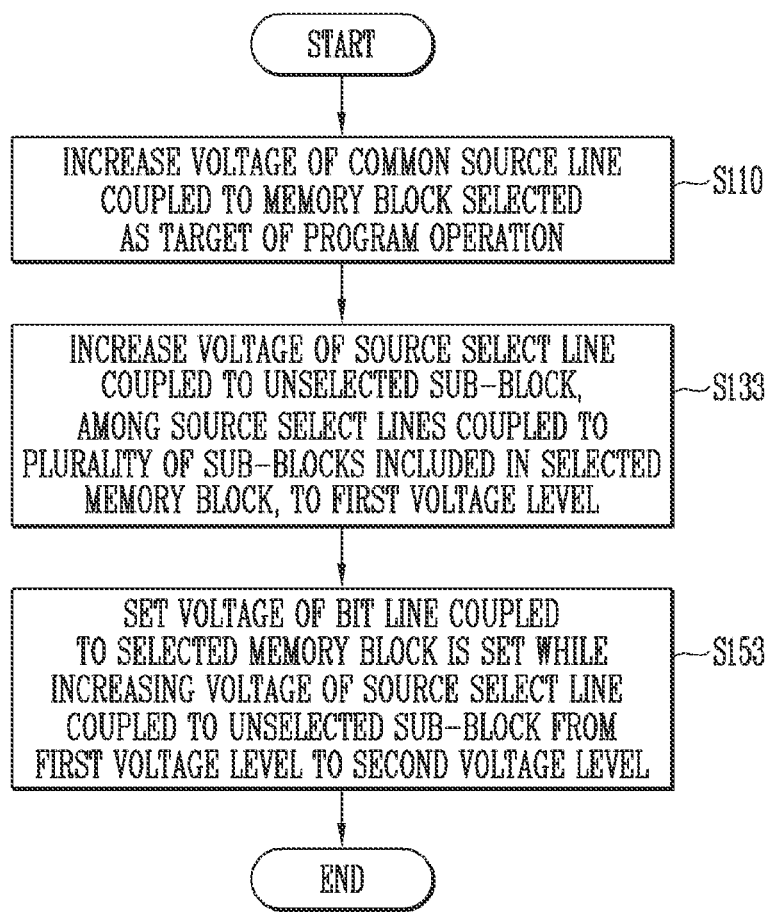
FIG. 13 is a flowchart, illustrating an embodiment of the method of operating a semiconductor memory device in FIG. 10.
Figure 14:
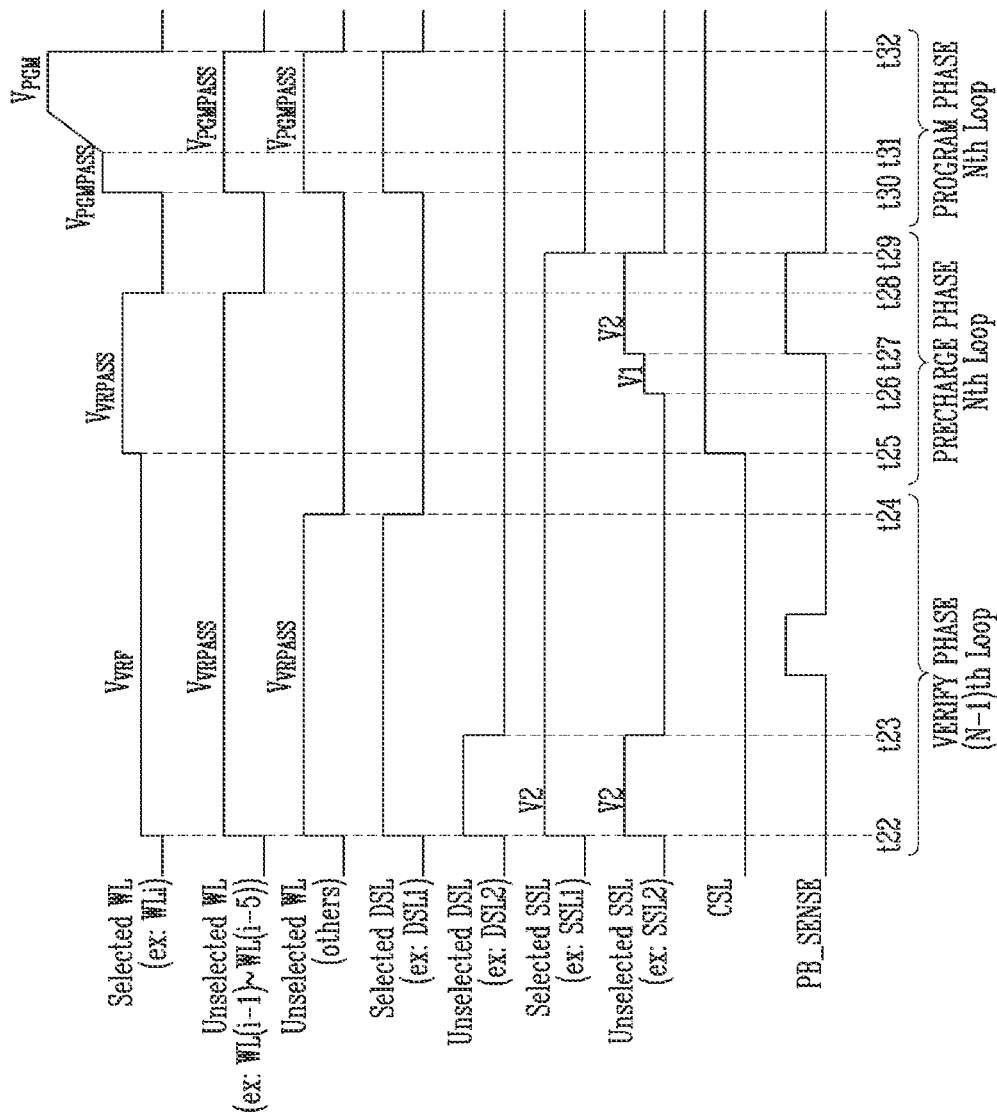
FIG. 14 is a timing diagram for explaining the embodiment of FIG. 13.

FIG. 13 is a flowchart, illustrating an embodiment of the method of operating a semiconductor memory device in FIG. 10. FIG. 14 is a timing diagram, explaining the embodiment of FIG. 13, Hereinafter, a description will be made with reference to FIGS. 13 and 14 together.

Referring to FIG. 13, based on the method of operating a semiconductor memory device, according to an embodiment of the present disclosure, the voltage of a common source line that is coupled to a memory block that is selected as the target of a program operation may increase at step S110. Thereafter, the voltage of a source select line coupled to an unselected sub-block, which is a sub-block that is not selected as the target of a program operation (program target), among source select lines that are coupled to a plurality of sub-blocks that are included in the selected memory block, may increase to a first voltage level at step S133. That is, at step S133, the voltage of a source select line that is coupled to the unselected sub-block, other than the target of the program operation, among all source select lines that are coupled to the memory block, may increase to the first voltage level. Thereafter, at step S153, the voltage of a bit line that is coupled to the selected memory block may be set while the voltage of the source select line that is coupled to the unselected sub-block is increasing from the first voltage level to a second voltage level. Here, from the verify phase, prior to the precharge phase that is performed at steps that are illustrated in FIG. 13, the voltage that is applied to the source select line that is coupled to the selected sub-block may be maintained at the second voltage level.

That is, in the state in which the voltage of the common source line increases at step S110, the voltage of the source select line that is coupled to the unselected sub-block, among source select lines that is coupled to the memory block, may first increase to the first voltage level at step S133. At subsequent step S153, the bit line voltage setting operation may be performed while the voltage of the source select line that is coupled to the unselected sub-block is increasing from the first voltage level to the second voltage level. Accordingly, the current that is consumed by the string precharge operation at steps S133 and S153 may be dispersed.

Referring to FIG. 14, a verify phase in an (N−1)-th program loop and a precharge phase and a program phase in an N-th program loop are illustrated. Referring to FIG. 14, the case in which, of first and second sub-blocks included in a memory block, the first sub-block is selected as a program target is illustrated. In detail, the case in which, among memory cells that are included in the first sub-block, memory cells coupled to an i-th word line WLi are selected as program target memory cells is illustrated in FIG. 14.

At time t22 in the verify phase, the verify voltage $V_{VRF}$ may be applied to the selected word line WLi, and a verify pass voltage $V_{VRPASS}$ may be applied to unselected word lines. Meanwhile, a turn-on voltage may be applied to the drain select lines DSL1 and DSL2 and the source select lines SSL1 and SSL2. In an example, the turn-on voltage that is applied to the source select lines SSL1 and SSL2 may have a second voltage level V2, The second voltage level V2 may be substantially the same as the voltage level Va that is illustrated in FIG. 9. At subsequent time t23, a turn-off voltage may be applied to the unselected drain select line DSL2 and the unselected source select line SSL2. During at least a part of an interval between time t23 and time t24, a page buffer sensing signal PB_SENSE may be enabled to a turn-on voltage, and thus, the threshold voltages of the selected memory cells may be sensed. At subsequent time t24, the verify operation may be terminated. Accordingly, the turn-off voltage may be applied to some word lines and the drain select lines. In the embodiment, illustrated in FIG. 14, the voltage of the first source select line SSL1 that is coupled to the selected first sub-block SUB BLOCK 1 may be maintained at the second voltage level V2.

At time t25 in the precharge phase, the voltage of the common source line may increase. This may correspond to step S110 of FIGS. 10 and 13. The voltage that is applied to the common source line may be a voltage for precharging the strings that are included in the unselected sub-block. Further, at time t25, the voltage that is applied to the selected word line may increase from the verify voltage $V_{VRF}$ to the verify pass voltage $V_{VRPASS}$. The verify pass voltage $V_{VRPASS}$ may be a voltage for turning on memory cells regardless of the threshold voltages of the memory cells.

At subsequent time t26, the voltage of the unselected second source select line SSL2 may increase to the first voltage level V1. This may correspond to step S130 of FIG. 10 or step S133 of FIG. 13. Here, the first voltage level V1 may be a voltage for slightly turning on the source select transistors that are coupled to the common source line CSL. Meanwhile, at time t26, the voltage of the selected first source select line SSL1 may be maintained at the second voltage level V2 from the previous verify phase.

At subsequent time t27, the voltage of the unselected second source select line SSL2 may increase from the first voltage level V1 to the second voltage level V2. The voltage of the first source select line SSL1 may be maintained at the second voltage level V2.

Meanwhile, at time t27 in the precharge phase, an operation of setting a bit line voltage may be performed. Accordingly, as described above, a program permission voltage or a program inhibition voltage may be applied to the bit lines BL1 to BLm by increasing the page buffer sensing signal PB_SENSE to the turn-on voltage.

At time t27, the operation of setting the bit line voltage by increasing the voltage of the unselected second source select line SSL2 from the first voltage level V1 to the second voltage level V2 and by increasing the page buffer sensing signal PB_SENSE to the turn-on voltage may correspond to S150 of FIG. 10 or step S153 of FIG. 13. Meanwhile, at time t28, the turn-off voltage may be applied to the selected word line WLi and the word lines WL(i−5) to WL(i−1) that is adjacent thereto.

At time t29, the string precharge operation and the bit line voltage setting operation may be terminated. Accordingly, the voltage that is applied to the source select lines may decrease to the turn-off voltage, and the voltage of the page buffer sensing signal PB_SENSE may also decrease to the turn-off voltage.

At time t30 in the program phase, the voltages of the word lines may increase to a program pass voltage $V_{PGMPASS}$. Also, the voltage of the first drain select line DSL1 that is coupled to the first sub-block SUB BLOCK 1, which is the selected sub-block, may increase to the turn-on voltage. The voltage of the second drain select line DSL2 that is coupled to the unselected second sub-block SUB BLOCK 2 may be maintained at the turn-off voltage.

At time t31, the voltage of the selected i-th word line WLi, among the word lines, may increase to a program voltage $V_{PGM}$. The voltages of the remaining word lines, that is, the unselected word lines, may be maintained at the program pass voltage $V_{PGMPASS}$. The program voltage $V_{PGM}$ that is applied to the selected i-th word line WLi may be maintained to time t32. At time t32, the program phase may be terminated.

In accordance with the embodiment, illustrated in FIGS. 13 and 14, the time at which the current is to be consumed may be dispersed by increasing the voltage of the source select line that is coupled to the unselected sub-block through a two-step process during the string precharge operation. Accordingly, the peak current to be used by the semiconductor memory device 100 may decrease.

Figure 15:
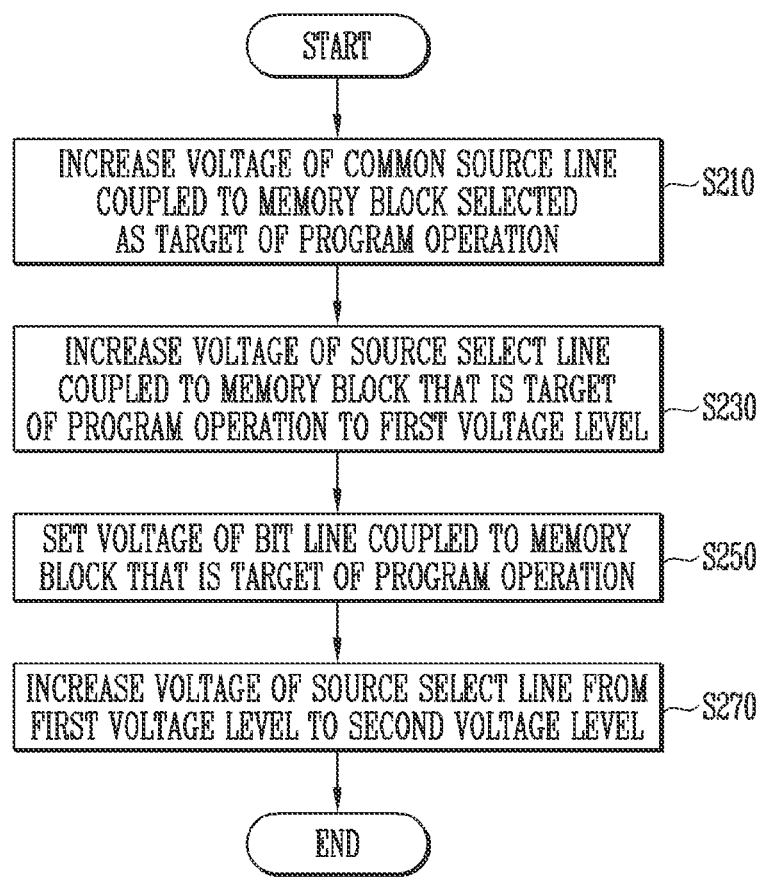
FIG. 15 is a flowchart, illustrating a method of operating a semiconductor memory device, according to an embodiment of the present disclosure.

FIG. 15 is a flowchart, illustrating a method of operating a semiconductor memory device, according to an embodiment of the present disclosure. Referring to FIG. 15, based on the method of operating a semiconductor memory device, according to an embodiment of the present disclosure, the voltage of a common source line that is coupled to a memory block that is selected as the target of a program operation may increase at step S210, the voltage of a source select line that is coupled to the memory block that is the target of the program operation may increase to a first voltage level at step S230, the voltage of a bit line that is coupled to the memory block that is the target of the program operation is set at step S250, and the voltage of the source select line may increase from the first voltage level to a second voltage level at step S270. The method illustrated in FIG. 15 is performed in the precharge phase that is illustrated in FIGS. 8 and 9.

That is, in the state in which the voltage of the common source line increases at step S210, the voltage of the source select line may first increase to the first voltage level at step S230. At subsequent step S250, the operation of setting the bit line voltage may be performed, and at subsequent step S270, the voltage of the source select line may increase from the first voltage level to the second voltage level. Accordingly, the current that is consumed by the string precharge operation at steps S230 and S270 may be dispersed. Further, the current that is consumed by the bit line voltage setting operation may also be separated from the current that is consumed by the above-described string precharge operation. Detailed embodiments of the method of operating the semiconductor memory device in FIG. 15 will be described below with reference to FIGS. 16 to 19.

Figure 16:
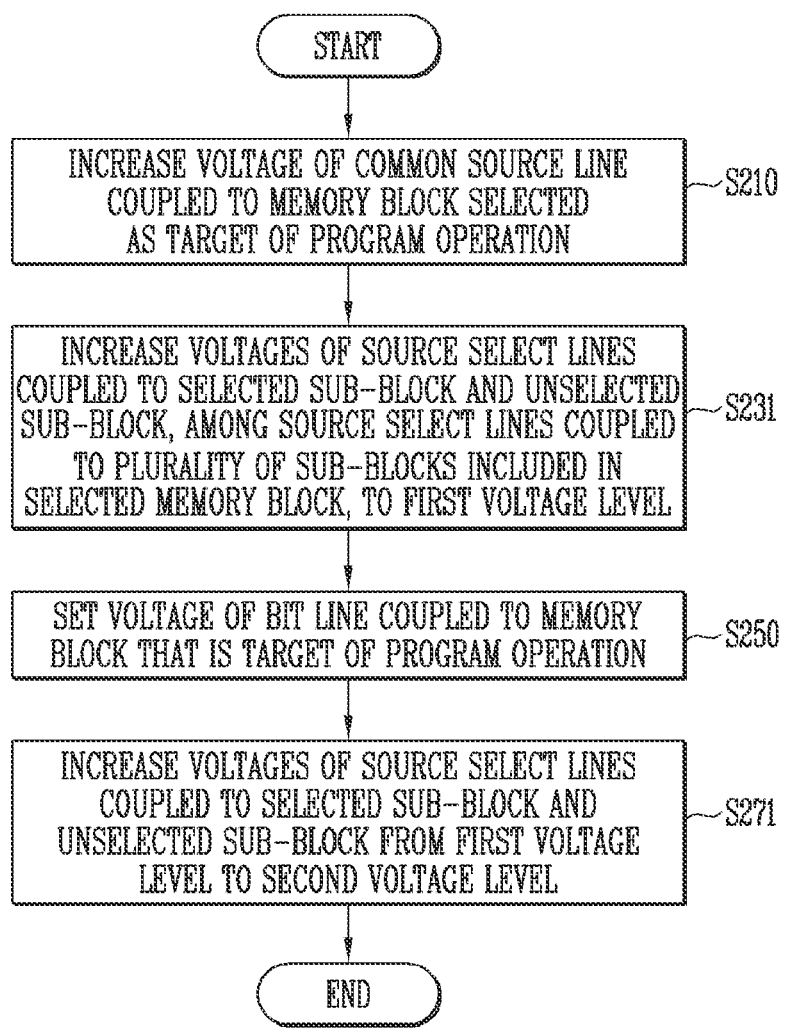
FIG. 16 is a flowchart, illustrating an embodiment of the method of operating a semiconductor memory device in FIG. 15.
Figure 17:
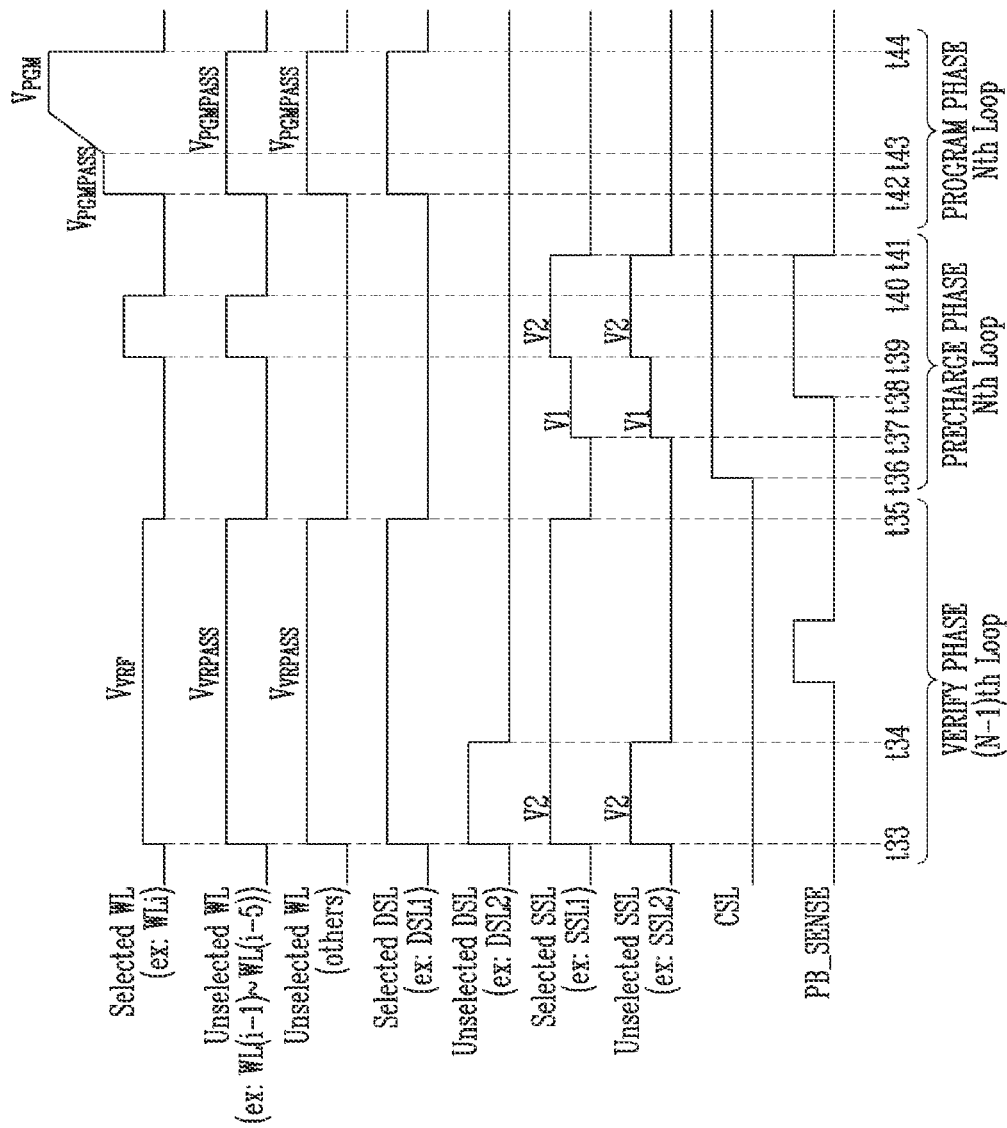
FIG. 17 is a timing diagram for explaining the embodiment of FIG. 16.

FIG. 16 is a flowchart, illustrating an embodiment of the method of operating a semiconductor memory device in FIG. 15. FIG. 17 is a timing diagram, explaining the embodiment of FIG. 16. Hereinafter, a description will be made with reference to FIGS. 16 and 17 together.

Referring to FIG. 16, based on the method of operating a semiconductor memory device, according to an embodiment of the present disclosure, the voltage of a common source line that is coupled to a memory block that is selected as the target of a program operation may increase at step S210. Thereafter, the voltages of source select lines that are coupled to a sub-block that is selected as the program target and an unselected sub-block, among source select lines that are coupled to a plurality of sub-blocks that are included in the selected memory block, are increased to the first voltage level at step S231, That is, at step S231, the voltages of all source select lines that are coupled to the memory block may increase to the first voltage level. Thereafter, the bit line voltage that is coupled to the selected memory block may be set at step S250. Thereafter, the voltages of source select lines that is coupled to the selected sub-block and the unselected sub-block may increase from the first voltage level to the second voltage level at step S271.

That is, in the state in which the voltage of the common source line increases at step S210, the voltages of all source select lines that are coupled to the memory block may first increase to the first voltage level at step S231. At subsequent step S250, the operation of setting the bit line voltage may be performed, and at subsequent step S271, the voltages of all of the source select lines may increase from the first voltage level to the second voltage level. Accordingly, the current that is consumed by the string precharge operation and the bit line voltage setting operation may be dispersed at steps S231, S250, and S271.

Referring to FIG. 17, a verify phase in an (N−1)-th program loop, a precharge phase in an N-th program loop, and a program phase in an N-th program loop are illustrated. Referring to FIG. 17, the case in which, of first and second sub-blocks included in a memory block, the first sub-block is selected as a program target is illustrated. In detail, the case in which, among memory cells included in the first sub-block, memory cells coupled to an i-th word line WLi are selected as program target memory cells is illustrated in FIG. 17.

At time t33 in the verify phase, the verify voltage $V_{VRF}$ may be applied to the selected word line WLi, and a verify pass voltage $V_{VRPASS}$ may be applied to unselected word lines. Meanwhile, a turn-on voltage may be applied to the drain select lines DSL1 and DSL2 and the source select lines SSL1 and SSL2. In an example, the turn-on voltage applied to the source select lines SSL1 and SSL2 may have a second voltage level V2. The second voltage level V2 may be substantially the same as the voltage level Va that is illustrated in FIG. 9. At subsequent time t34, a turn-off voltage may be applied to the unselected drain select line DSL2 and the unselected source select line SSL2. During at least a part of an interval between time t34 and time t35, the page buffer sensing signal PB_SENSE may be enabled to a turn-on voltage, and thus, the threshold voltages of the selected memory cells may be sensed. At subsequent time t35, the verify operation may be terminated. Accordingly, a turn-off voltage may be applied to the word lines, the drain select lines, and the source select lines.

At time t36 in the precharge phase, the voltage of the common source line may increase. This may correspond to step S210 of FIGS. 15 and 16. The voltage that is applied to the common source line may be a voltage for precharging the strings that are included in the unselected sub-block. At subsequent time t37, the voltages of the selected first source select line SSL1 and the unselected second source select line 55L2 may increase to the first voltage level V1. This may correspond to step S230 of FIG. 15 or step S231 of FIG. 16. Here, the first voltage level V1 may be a voltage for slightly turning on the source select transistors that are coupled to the common source line CSL.

Thereafter, at time t38 in the precharge phase, an operation of setting a bit line voltage may be performed. Accordingly, as described above, a program permission voltage or a program inhibition voltage may be applied to the bit lines BL1 to BLm by increasing the page buffer sensing signal PB_SENSE to the turn-on voltage. This may correspond to step S250 of FIGS. 15 and 16.

At subsequent time t39, the voltages of the selected first source select line SSL1 and the unselected second source select line SSL2 may increase from the first voltage level V1 to the second voltage level V2. This may correspond to step S270 of FIG. 15 or step S271 of FIG. 16.

Meanwhile, a turn-on voltage may be applied to the selected word line WLi and the word lines WL(i−5) to WL(i−1) that are adjacent thereto at time t39 so that the string precharge operation may smoothly progress. At subsequent time t40, the turn-off voltage may be applied to the selected word line WLi and the word lines WL(i−5) to WL(i−1) that are adjacent thereto. In the embodiment, illustrated in FIG. 17, the turn-on voltage is illustrated as being applied to the selected word line WLi and the word lines WL(i−5) to WL(i−1) that are adjacent thereto at time t39 so that the string precharge operation smoothly progresses. However, in accordance with an embodiment, the turn-on voltage may be applied to the word lines at time t37 at which the voltages of the source select lines increase to the first voltage level.

At time t41, the string precharge operation and the bit line voltage setting operation may be terminated. Accordingly, the voltage that is applied to the source select lines may decrease to the turn-off voltage, and the voltage of the page buffer sensing signal PB_SENSE may also decrease to the turn-off voltage.

At time t42 in the program phase, the voltages of the word lines may increase to a program pass voltage $V_{PGMPASS}$. Also, the voltage of the first drain select line DSL1 that is coupled to the first sub-block SUB BLOCK 1, which is the selected sub-block, may increase to the turn-on voltage. The voltage of the second drain select line DSL2 that is coupled to the unselected second sub-block SUB BLOCK 2 may be maintained at the turn-off voltage.

At time t43, the voltage of the selected i-th word line WLi, among the word lines, may increase to a program voltage $V_{PGM}$. The voltages of the remaining word lines, that is, the unselected word lines, may be maintained at the program pass voltage $V_{PGMPASS}$. The program voltage $V_{PGM}$ that is applied to the selected i-th word line WLi may be maintained to time t44. At time t44, the program phase is terminated.

In accordance with the embodiment, illustrated in FIGS. 16 and 17, the time at which the current is to be consumed may be dispersed by increasing the voltage of the source select lines through a two-step process during the string precharge operation. In this case, after the voltage of the source select line increases to the first voltage level V1, the bit line voltage setting operation may begin, after which the voltage of the source select line may increase to the second voltage level V2. Accordingly, during the string precharge operation and the bit line voltage setting operation, the peak current that is consumed by the semiconductor memory device 100 may decrease.

Figure 18:
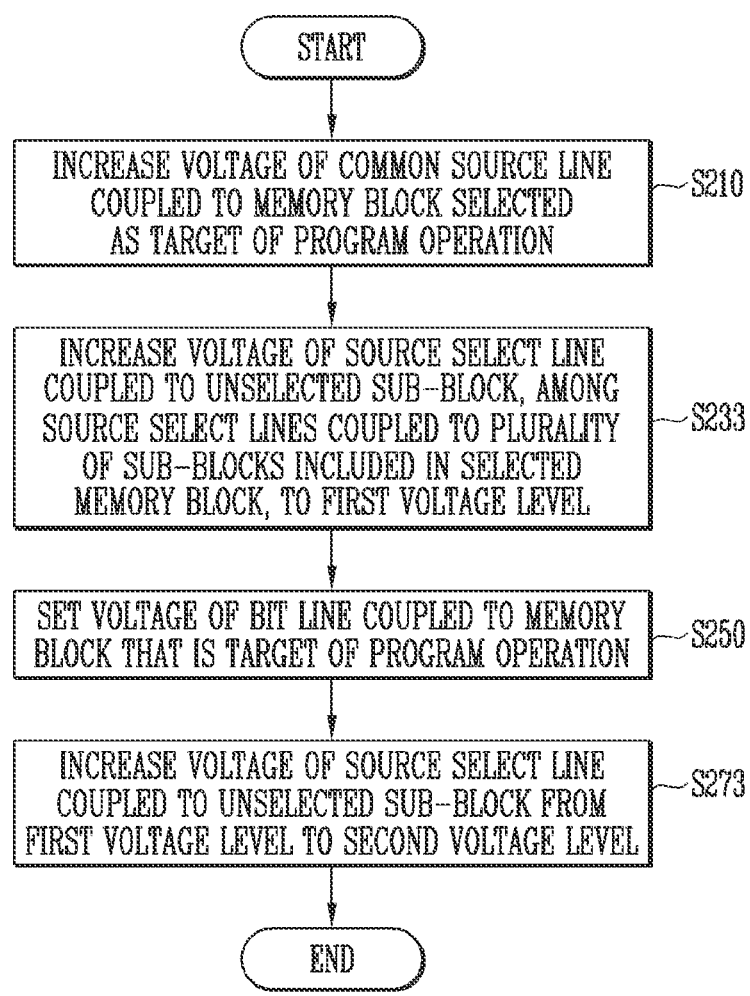
FIG. 18 is a flowchart, illustrating an embodiment of the method of operating a semiconductor memory device in FIG. 15.
Figure 19:
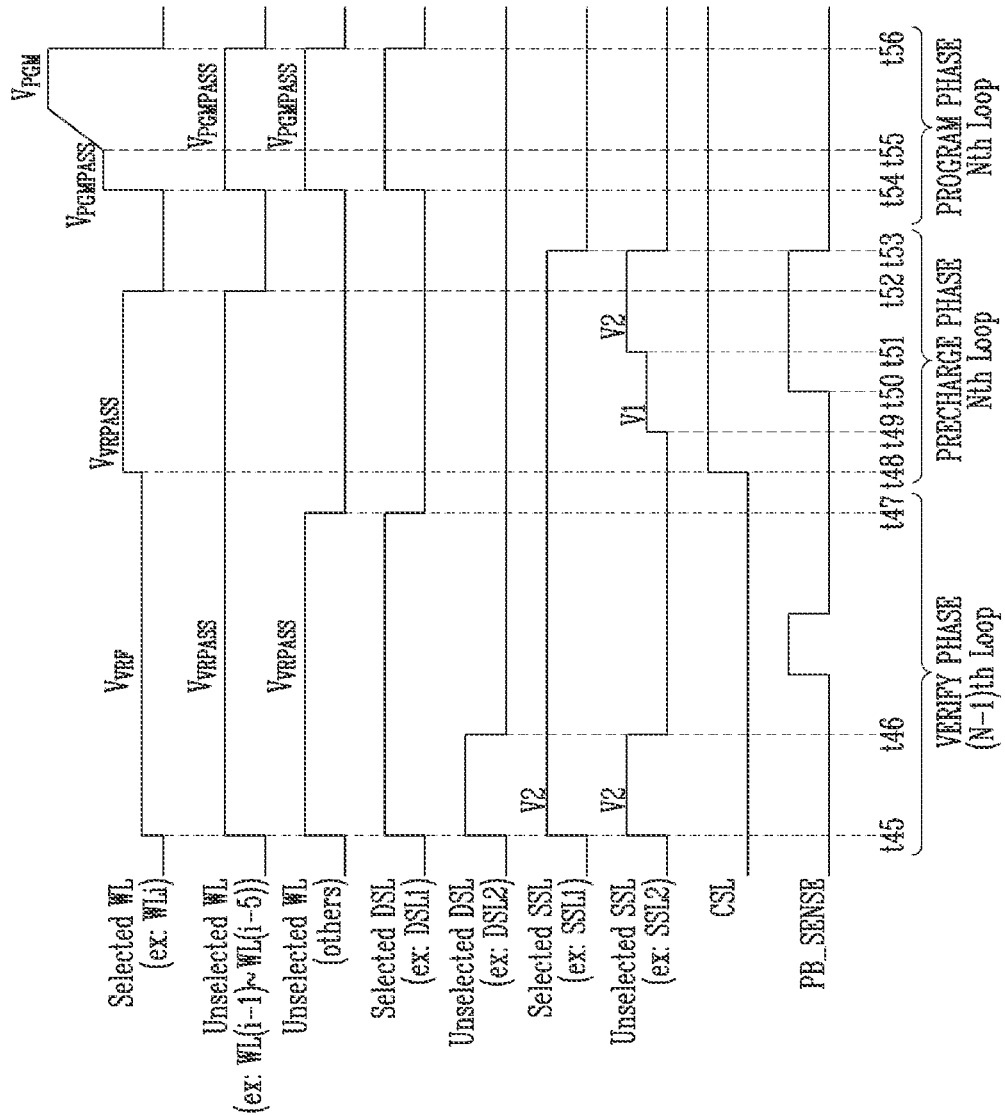
FIG. 19 is a timing diagram for explaining the embodiment of FIG. 18.

FIG. 18 is a flowchart, illustrating an embodiment of the method of operating a semiconductor memory device in FIG. 15. FIG. 19 is a timing diagram, explaining the embodiment of FIG. 18. Hereinafter, a description will be made with reference to FIGS. 18 and 19 together.

Referring to FIG. 18, based on the method of operating a semiconductor memory device, according to an embodiment of the present disclosure, the voltage of a common source line that is coupled to a memory block that is selected as the target of a program operation may increase at step S210. Thereafter, the voltage of a source select line that is coupled to an unselected sub-block, which is a sub-block that is not selected as the target of a program operation (program target), among source select lines that are coupled to a plurality of sub-blocks that are included in the selected memory block, may increase to a first voltage level at step S233. That is, at step S233, the voltage of a source select line that is coupled to the unselected sub-block, other than the target of the program operation, among all source select lines that are coupled to the memory block, may increase to the first voltage level. Thereafter, the voltage of bit line that is coupled to the selected memory block is set at step S250. Thereafter, the voltage of the source select line that is coupled to the unselected sub-block may increase from the first voltage level to the second voltage level at step S273. Here, from the verify phase, prior to the precharge phase that is performed at steps that are illustrated in FIG. 18, the voltage that is applied to the source select line that is coupled to the selected sub-block may be maintained at the second voltage level.

That is, in the state in which the voltage of the common source line increases at step S210, the voltage of the source select line coupled to the unselected sub-block, among source select lines coupled to the memory block, may first increase to the first voltage level at step S233. At subsequent step S250, the operation of setting the bit line voltage may be performed, and at subsequent step S273, the voltage of the source select line that is coupled to the unselected sub-block may increase from the first voltage level to the second voltage level. Accordingly, the current that is consumed by the string precharge operation and the bit line voltage setting operation is dispersed at steps S233, S250, and S273.

Referring to FIG. 19, a verify phase in an (N−1)-th program loop and a precharge phase and a program phase in an N-th program loop are illustrated. Referring to FIG. 19, the case in which, of first and second sub-blocks included in a memory block, the first sub-block is selected as a program target is illustrated. In detail, the case in which, among memory cells that are included in the first sub-block, memory cells that are coupled to an i-th word line WLi are selected as program target memory cells is illustrated in FIG. 19.

At time t45 in the verify phase, the verify voltage $V_{VRF}$ may be applied to the selected word line WLi, and a verify pass voltage $V_{VRPASS}$ may be applied to unselected word lines. Meanwhile, a turn-on voltage may be applied to the drain select lines DSL1 and DSL2 and the source select lines SSL1 and SSL2. In an example, the turn-on voltage that is applied to the source select lines SSL1 and SSL2 may have a second voltage level V2. The second voltage level V2 may be substantially the same as the voltage level Va that is illustrated in FIG. 9. At subsequent time t46, a turn-off voltage may be applied to the unselected drain select line DSL2 and the unselected source select line SSL2. During at least a part of an interval between time t46 and time t47, a page buffer sensing signal PB_SENSE may be enabled to a turn-on voltage, and thus, the threshold voltages of the selected memory cells may be sensed. At subsequent time t47, the verify operation may be terminated. Accordingly, the turn-off voltage may be applied to some word lines and the drain select lines. In the embodiment, illustrated in FIG. 19, the voltage of the first source select line SSL1 that is coupled to the selected first sub-block SUB BLOCK 1 may be maintained at the second voltage level V2.

At time t48 in the precharge phase, the voltage of the common source line may increase. This may correspond to step S210 of FIGS. 15 and 18. The voltage that is applied to the common source line may be a voltage for precharging the strings that are included in the unselected sub-block. Further, at time t48, the voltage that is applied to the selected word line may increase from the verify voltage $V_{VRF}$ to the verify pass voltage $V_{VRPASS}$. The verify pass voltage $V_{VRPASS}$ may be a voltage for turning on memory cells regardless of the threshold voltages of the memory cells.

At subsequent time t49, the voltage of the unselected second source select line SSL2 may increase to the first voltage level V1. This may correspond to step S230 of FIG. 15 or step S233 of FIG. 18. Here, the first voltage level V1 may be a voltage for slightly turning on the source select transistors that are coupled to the common source line CSL. Meanwhile, at time t49, the voltage of the selected first source select line SSL1 may be maintained at the second voltage level V2 from the previous verify phase.

Thereafter, at time t50 in the precharge phase, the operation of setting the bit line voltage may be performed. Accordingly, as described above, a program permission voltage or a program inhibition voltage may be applied to the bit lines BL1 to BLm by increasing the page buffer sensing signal PB_SENSE to the turn-on voltage. This may correspond to step S250 of FIGS. 15 and 18.

Thereafter, at time t51 in the precharge phase, the voltage of the unselected second source select line SSL2 may increase from the first voltage level V1 to the second voltage level V2. This may correspond to step S270 of FIG. 15 or step S273 of FIG. 18. At this time, the voltage of the first source select line SSL1 may be maintained at the second voltage level V2. Meanwhile, at time t52, the turn-off voltage may be applied to the selected word line WLi and the word lines WL(i−5) to WL(i−1) that are adjacent thereto.

At time t53, the string precharge operation and the bit line voltage setting operation may be terminated. Accordingly, the voltage applied to the source select lines may decrease to the turn-off voltage, and the voltage of the page buffer sensing signal PB_SENSE may also decrease to the turn-off voltage.

At time t54 in the program phase, the voltages of the word lines may increase to a program pass voltage $V_{PGMPASS}$. Also, the voltage of the first drain select line DSL1 that is coupled to the first sub-block SUB BLOCK 1, which is the selected sub-block, may increase to the turn-on voltage. The voltage of the second drain select line DSL2 that is coupled to the unselected second sub-block SUB BLOCK 2 may be maintained at the turn-off voltage.

At time t55, the voltage of the selected i-th word line WLi, among the word lines, may increase to a program voltage $V_{PGM}$. The voltages of the remaining word lines, that is, the unselected word lines, may be maintained at the program pass voltage $V_{PGMPASS}$. The program voltage $V_{PGM}$ that is applied to the selected i-th word line WLi may be maintained to time t56. At time t56, the program phase may be terminated.

Figure 20:
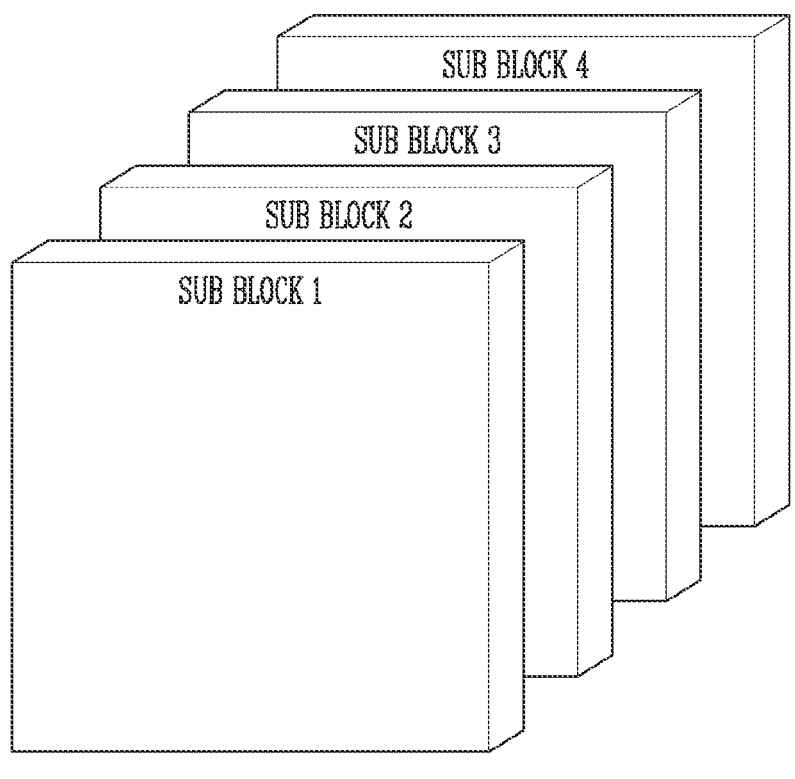
FIG. 20 is a diagram, illustrating an example of sub-blocks that form a memory block.
Figure 21:
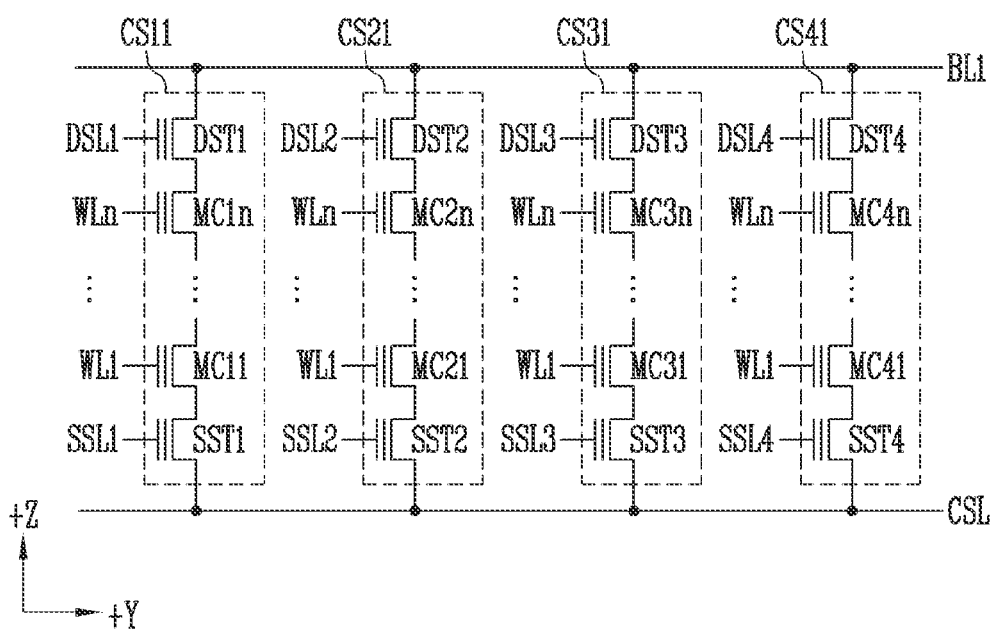
FIG. 21 is a circuit diagram, illustrating a part of a cell string, included in each of first to fourth sub-blocks.

In accordance with the embodiment, illustrated in FIGS. 18 and 19, the time at which the current is to be consumed may be dispersed by increasing the voltage of the source select line that is coupled to the unselected sub-block through a two-step process during the string precharge operation. In this case, after the voltage of the unselected source select line increases to the first voltage level V1, the bit line voltage setting operation may begin, after which the voltage of the unselected source select line may increase to the second voltage level V2. Accordingly, during the string precharge operation and the bit line voltage setting operation, the peak current that is consumed by the semiconductor memory device 100 may decrease, FIG. 20 is a diagram, illustrating an example of sub-blocks that form a memory block. FIG. 21 is a circuit diagram, illustrating some of cell strings, included in first to fourth sub-blocks.

Referring to FIG. 20, the memory block may include four sub-blocks SUB BLOCK 1 to SUB BLOCK 4. As described above with reference to FIG. 4, the sub-blocks that are included in the memory block may be defined as cell strings that share a drain select line or a source select line. Although the memory block of FIG. 5 includes two sub-blocks, the memory block may be configured to include four sub-blocks, as illustrated in FIG. 20.

Referring to FIG. 21, a cell string CS11 that is included in the first sub-block SUB BLOCK 1, a cell string CS21 that is included in the second sub-block SUB BLOCK 2, a cell string CS31 that is included in the third sub-block SUB BLOCK 3, and a cell string CS41 that is included in the fourth sub-block SUB BLOCK 4 are illustrated. FIG. 21 may be a circuit diagram that illustrates the memory block of FIG. 20 in a +X direction.

The cell string CS11 in the first sub-block SUB BLOCK 1 may include memory cells MC11 to MC1n that are coupled between a first drain select transistor DST1 and a first source select transistor SST1. The cell string CS21 in the second sub-block SUB BLOCK 2 may include memory cells MC21 to MC2n that are coupled between a second drain select transistor DST2 and a second source select transistor SST2. The cell string CS31 in the third sub-block SUB BLOCK 3 may include memory cells MC31 to MC3n that are coupled between a third drain select transistor DST3 and a third source select transistor SST3. The cell string CS41 in the fourth sub-block SUB BLOCK 4 may include memory cells MC41 to MC4n that are coupled between a fourth drain select transistor DST4 and a fourth source select transistor SST4.

With reference to FIGS. 9 to 19, the operation method, according to the present disclosure that is performed on the memory block with two sub-blocks, has been described. However, the operation method, according to the present disclosure, may also be applied to the memory block with fourth sub-blocks, as illustrated in FIGS. 20 and 21. In this case, when a sub-block (e.g., the first sub-block) is selected as a program target, a source select line (e.g., SSL1) that is coupled to the corresponding sub-block may be the selected source select line. Meanwhile, the source select lines (e.g., SSL2 to SSL4) respectively coupled to the remaining three sub-blocks (e.g., second to fourth sub-blocks) may be unselected source select lines.

Figure 22:
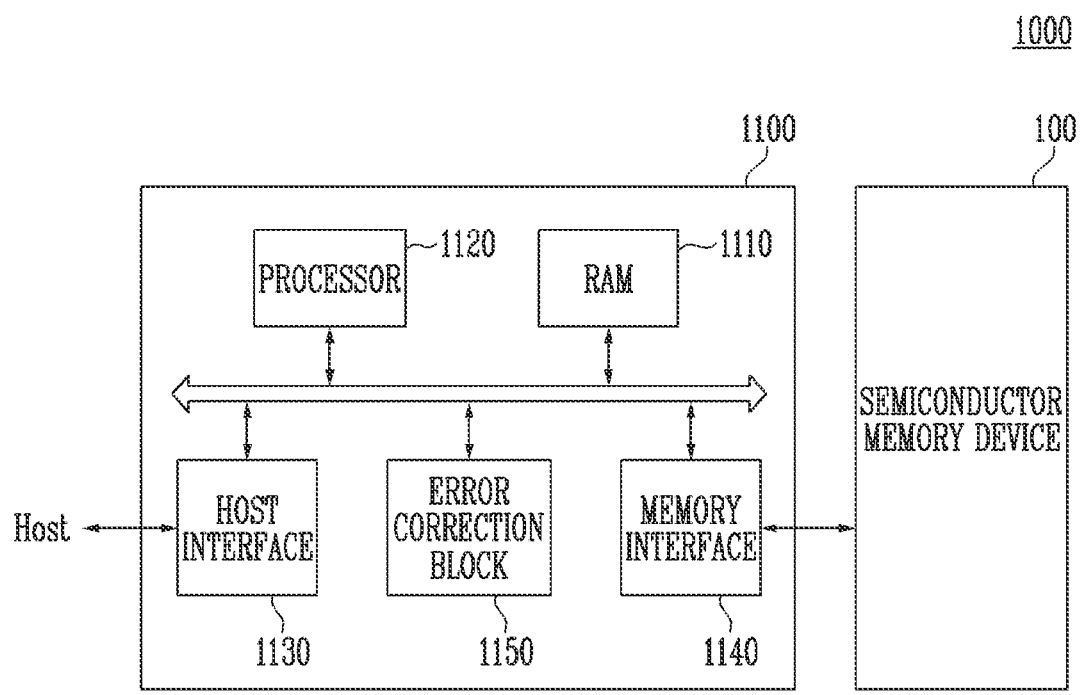
FIG. 22 is a block diagram, illustrating an embodiment of a memory system 1000 with the semiconductor memory device 100 of FIG. 1.

FIG. 22 is a block diagram, illustrating an embodiment of a memory system 1000 with the semiconductor memory device 100 of FIG. 1.

Referring to FIG. 22, the memory system 1000 may include a semiconductor memory device 100 and a memory controller 1100. The semiconductor memory device 100 may be the semiconductor memory device that is described with reference to FIG. 1.

The memory controller 1100 may be coupled to a host Host and the semiconductor memory device 100, The memory controller 1100 may access the semiconductor memory device 100 based on a request from the host Host. For example, the memory controller 1100 may control read, write, erase, and background operations of the semiconductor memory device 100. The memory controller 1100 may provide an interface between the semiconductor memory device 100 and the host Host. The memory controller 1100 may run firmware for controlling the semiconductor memory device 100.

The memory controller 1100 may include a random access memory (RAM) 1110, a processor 1120, a host interface 1130, a memory interface 1140, and an error correction block 1150. The RAM 1110 may be used as at least one of a working memory for the processor 1120, a cache memory between the semiconductor memory device 100 and the host, and a buffer memory between the semiconductor memory device 100 and the host. The processor 1120 may control the overall operation of the memory controller 1100. In addition, the memory controller 1100 may temporarily store program data provided from the host Host during a write operation.

The host interface 1130 may include a protocol for performing data exchange between the host Host and the memory controller 1100. In an embodiment, the memory controller 1100 may communicate with the host Host through at least one of various interface protocols, such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer system interface (SCSI) protocol, an enhanced small disk interface (ESDI) protocol, an integrated drive electronics (IDE) protocol, and a private protocol.

The memory interface 1140 may interface with the semiconductor memory device 100. For example, the memory interface may include a NAND interface or NOR interface.

The error correction block 1150 may detect and correct errors in data received from the semiconductor memory device 100 using an error correction code (ECC). The processor 1120 may adjust the read voltage based on the result of error detection by the error correction block 1150 and may control the semiconductor memory device 100 to perform re-reading. In an example embodiment, the error correction block may be provided as an element of the memory controller 1100.

The memory controller 1100 and the semiconductor memory device 100 may be integrated into a single semiconductor device. In an embodiment, the memory controller 1100 and the semiconductor memory device 100 may be integrated into a single semiconductor device to form a memory card. For example, the memory controller 1100 and the semiconductor memory device 100 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), or a universal flash storage (UFS).

The memory controller 1100 and the semiconductor memory device 100 may be integrated into a single semiconductor device to form a solid state drive (SSD). The SSD may include a storage device that is configured to store data in a semiconductor memory. When the memory system 1000 is used as the SSD, an operation speed of the host Host coupled to the memory system 1000 may be remarkably improved.

In an embodiment, the memory system 1000 may be provided as one of various elements of an electronic device such as a computer, an ultra mobile PC (UMPC), a workstation, a net-book, a personal digital assistant (PDA), a portable computer, a web tablet, a wireless phone, a mobile phone, a smartphone, an e-book, a portable multimedia player (PMP), a game console, a navigation device, a black box, a digital camera, a three-dimensional (3D) television, a digital audio recorder, a digital audio player, a digital picture recorder, a digital picture player, a digital video recorder, a digital video player, a device capable of transmitting/receiving information in an wireless environment, one of various electronic devices for forming a home network, one of various electronic devices for forming a computer network, one of various electronic devices for forming a telematics network, a radio frequency identification (RFID) device, or one of various elements for forming a computing system.

In an exemplary embodiment, the semiconductor memory device 100 or the memory system 1000 may be mounted in various types of packages. For example, the semiconductor memory device 100 or the memory system 1000 may be packaged and mounted in a type such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Hat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), or Wafer-Level Processed Stack Package (WSP).

Figure 23:
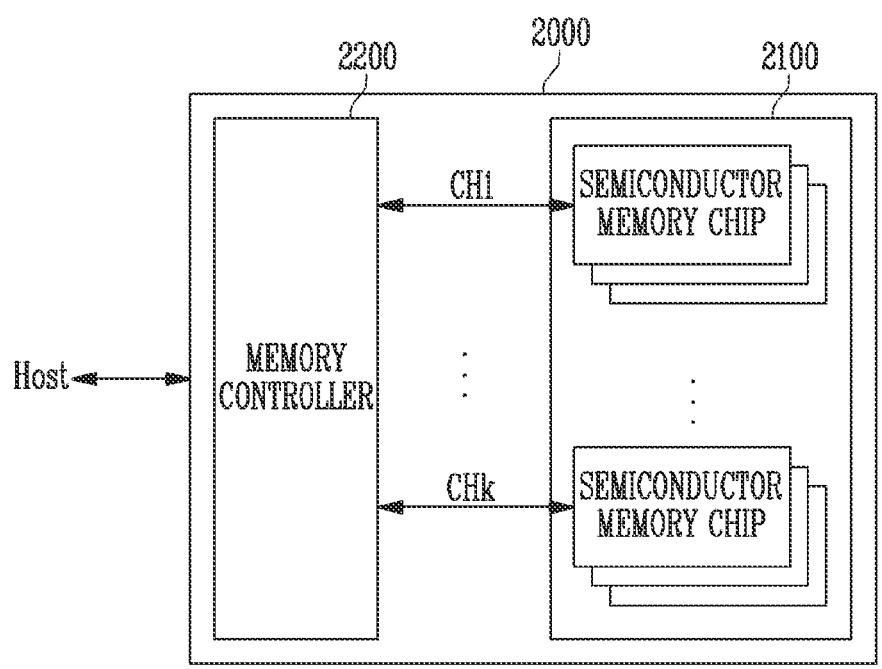
FIG. 23 is a block diagram, illustrating an example of application of the memory system of FIG. 22.

FIG. 23 is a block diagram, illustrating an example of application of the memory system of FIG. 22.

Referring to FIG. 23, the memory system 2000 may include a semiconductor memory device 2100 and a memory controller 2200, The semiconductor memory device 2100 may include a plurality of semiconductor memory chips. The semiconductor memory chips are divided into a plurality of groups.

In FIG. 23, it is illustrated that the plurality of groups communicate with the memory controller 2200 through first to k-th channels CH1 to CHk. Each semiconductor memory chip may be configured and operated in the same manner as those of the semiconductor memory device 100 described with reference to FIG. 1.

Each group may communicate with the memory controller 2200 through one common channel. The memory controller 2200 may have the same configuration as the memory controller 1100 described with reference to FIG. 22 and may control the plurality of memory chips of the semiconductor memory device 2100 through the plurality of channels CH1 to CHk.

Figure 24:
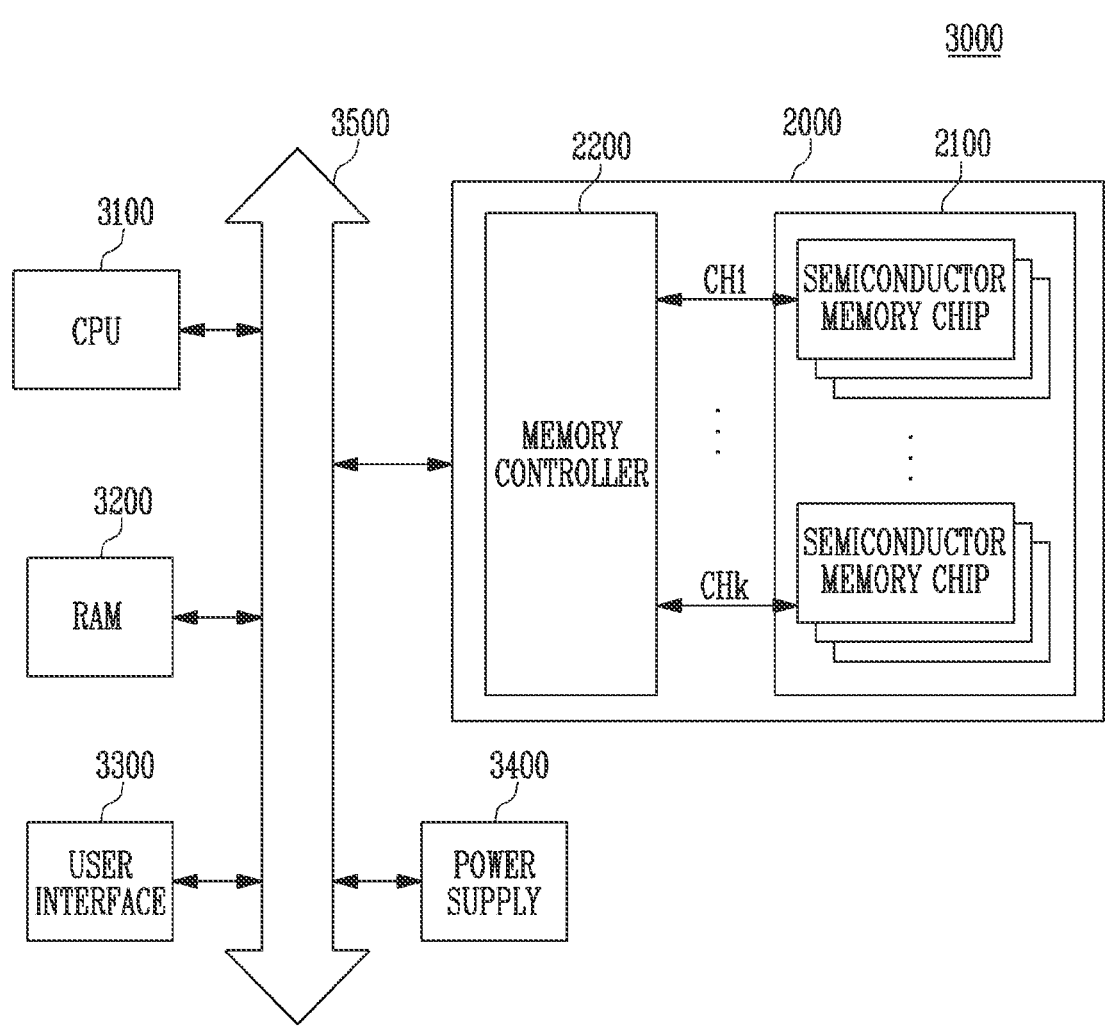
FIG. 24 is a block diagram, illustrating a computing system with the memory system, described with reference to FIG. 23.

FIG. 24 is a block diagram, illustrating a computing system with the memory system described with reference to FIG. 23.

A computing system 3000 may include a central processing unit (CPU) 3100, a RAM 3200, a user interface 3300, a power supply 3400, a system bus 3500, and a memory system 2000.

The memory system 2000 may be electrically coupled to the CPU 3100, the RAM 3200, the user interface 3300, and the power supply 3400 through the system bus 3500. Data provided through the user interface 3300 or processed by the CPU 3100 may be stored in the memory system 2000.

In FIG. 24, a semiconductor memory device 2100 is illustrated as being coupled to the system bus 3500 through the memory controller 2200. However, the semiconductor memory device 2100 may be directly coupled to the system bus 3500. Here, the function of the memory controller 2200 may be performed by the CPU 3100 and the RAM 3200.

In FIG. 24, the memory system 2000, described with reference to FIG. 23, is illustrated. However, the memory system 2000 may be replaced with the memory system 1000 described with reference to FIG. 22. In an exemplary embodiment, the computing system 3000 may include both the memory systems 1000 and 2000 described with reference to FIGS. 22 and 23.

Furthermore, the embodiments disclosed in the present specification and the drawings aims to help those with ordinary knowledge in this art more clearly understand the present disclosure rather than aiming to limit the bounds of the present disclosure. Therefore, one of ordinary skill in the art to which the present disclosure belongs will be able to easily understand that various modifications are possible based on the technical scope of the present disclosure.

The present disclosure may provide a semiconductor memory device that is capable of reducing a peak current, and a method of operating the semiconductor memory device.

What is claimed is:

1. A semiconductor memory device, comprising:
a memory block with a plurality of sub-blocks that are coupled to a plurality of source select lines, respectively;
a peripheral circuit configured to perform a data program operation on the memory block; and
a control logic configured to control the peripheral circuit to:
increase a voltage of a common source line that is coupled to the memory block,
increase a voltage of at least one source select line, among the plurality of source select lines, to a first voltage level, and
set a voltage of a bit line that is coupled to the memory block and increase the voltage of the at least one source select line from the first voltage level to a second voltage level.

2. The semiconductor memory device according to claim 1, wherein the control logic is configured to control the peripheral circuit to increase a voltage of a first source select line that is coupled to a sub-block that is selected as a program target, among the plurality of source select lines, and a voltage of a second source select line that is coupled to at least one sub-block, other than the program target, among the plurality of source select lines, to the first voltage level.

3. The semiconductor memory device according to claim 2, wherein the control logic is configured to control the peripheral circuit to increase the voltages of the first source select line and the second source select line from the first voltage level to the second voltage level.

4. The semiconductor memory device according to claim 1, wherein the second voltage level is a voltage that enables a transistor that is coupled to the at least one source select line to be turned on.

5. The semiconductor memory device according to claim 1, wherein the control logic is configured to control the peripheral circuit to increase a voltage of a second source select line that is coupled to at least one sub-block that is not selected as a program target, among the plurality of source select lines, to the first voltage level in a state in which a voltage of a first source select line, coupled to a sub-block that is selected as the program target, is maintained at the second voltage level.

6. The semiconductor memory device according to claim 5, wherein the control logic is configured to control the peripheral circuit to increase the voltage of the second source select line from the first voltage level to the second voltage level in a state in which the voltage of the first source select line is maintained at the second voltage level.

7. The semiconductor memory device according to claim 1, wherein the control logic is configured to control the peripheral circuit to:
set the voltage of the bit line after increasing the voltage of the at least one source select line to the first voltage level, and
increase the voltage of the at least one source select line from the first voltage level to the second voltage level after setting of the voltage of the bit line has started.

8. A method of operating a semiconductor memory device, for programming a memory block with a plurality of sub-blocks that are coupled to a plurality of source select lines, respectively, the method comprising:
increasing a voltage of a common source line that is coupled to the memory block;
increasing a voltage of at least one source select line, among the plurality of source select lines, to a first voltage level; and
setting a voltage of a bit line that is coupled to the memory block while increasing the voltage of the at least one source select line from the first voltage level to a second voltage level.

9. The method according to claim 8, wherein the increasing of the voltage of the at least one source select line, among the plurality of source select lines, to the first voltage level comprises:
increasing a voltage of a first source select line that is coupled to a sub-block that is selected as a program target, among the plurality of sub-blocks, and a voltage of a second source select line that is coupled to at least one sub-block, other than the program target, to the first voltage level.

10. The method according to claim 9, wherein the setting of the voltage of the bit line that is coupled to the memory block whale increasing the voltage of the at least one source select line from the first voltage level to the second voltage level comprises:
increasing the voltages of the first source select line and the second source select line from the first voltage level to the second voltage level.

11. The method according to claim 8, wherein the setting of the voltage of the bit line that is coupled to the memory block while increasing the voltage of the at least one source select line from the first voltage level to the second voltage level comprises:
setting a voltage to be applied to each of a plurality of bit lines that is coupled to the memory block to one of a program permission voltage and a program inhibition voltage to program memory cells that are included in a page of one of the plurality of sub-blocks.

12. The method according to claim 8, wherein the increasing of the voltage of the at least one source select line, among the plurality of source select lines, to the first voltage level comprises:
maintaining a voltage of a first source select line that is coupled to a sub-block that is selected as a program target, among the plurality of source select lines, at the second voltage level; and
increasing a voltage of a second source select line, coupled to at least one sub-block that is not selected as a program target, to the first voltage level.

13. The method according to claim 12, wherein the setting of the voltage of the bit line that is coupled to the memory block while increasing the voltage of the at least one source select line from the first voltage level to the second voltage level comprises:
maintaining the voltage of the first source select line at the second voltage level; and
increasing the voltage of the second source select line from the first voltage level to the second voltage level.

14. A method of operating a semiconductor memory device, for programming a memory block with a plurality of sub-blocks that are coupled to a plurality of source select lines, respectively, the method comprising:
increasing a voltage of a common source line that is coupled to the memory block;

increasing a voltage of at least one source select line, among the plurality of source select lines, to a first voltage level;

setting a voltage of a bit line that is coupled to the memory block; and increasing a voltage of the at least one source select line from the first voltage level to a second voltage level.

15. The method according to claim 14, wherein the increasing of the voltage of at least one source select line, among the plurality of source select lines, to the first voltage level comprises:

increasing a voltage of a first source select line that is coupled to a sub-block that is selected as a program target, among the plurality of sub-blocks, and a voltage of a second source select line that is coupled to at least one sub-block, other than the program target, to the first voltage level.

16. The method according to claim 15, wherein the increasing of the voltage of the at least one source select line from the first voltage level to the second voltage level comprises:

increasing the voltages of the first source select line and the second source select line from the first voltage level to the second voltage level.

17. The method according to claim 14, wherein the setting of the voltage of the bit line that is coupled to the memory block comprises:

setting a voltage to be applied to each of a plurality of bit lines that is coupled to the memory block to one of a program permission voltage and a program inhibition voltage to program memory cells that are included in a page included in one of the plurality of sub-blocks.

18. The method according to claim 14, wherein the increasing of the voltage of at least one source select line, among the plurality of source select lines, to the first voltage level comprises:

maintaining a voltage of a first source select line that is coupled to a sub-block that is selected as a program target, among the plurality of source select lines, at the second voltage level; and increasing a voltage of a second source select line, coupled to at least one sub-block that is not selected as a program target, to the first voltage level.

19. The method according to claim 18, wherein the increasing of the voltage of the at least one source select line from the first voltage level to the second voltage level comprises:

maintaining the voltage of the first source select line at the second voltage level; and increasing the voltage of the second source select line from the first voltage level to the second voltage level.

* * * * *

UNITED STATES PATENT AND TRADEMARK OFFICE
CERTIFICATE OF CORRECTION

| | |
|---|---|
| PATENT NO. | : 11,410,731 B2 |
| APPLICATION NO. | : 17/176645 |
| DATED | : August 9, 2022 |
| INVENTOR(S) | : Jae Hyeon Shin et al. |

It is certified that error appears in the above-identified patent and that said Letters Patent is hereby corrected as shown below:

In the Specification

Please correct Column 6, Line 61 from "be coupled to bit lines extended in a column direction." to --be coupled to different bit lines extended in a column direction.--

Please correct Column 19, Line 60-61 from "Thereafter, the bit line voltage that is coupled to the selected memory block may be set at step S250." to --Thereafter, the voltage of bit line that is coupled to the selected memory block may be set at step S250.--

Signed and Sealed this
Seventh Day of November, 2023

Katherine Kelly Vidal
*Director of the United States Patent and Trademark Office*